United States Patent
Khaira et al.

(10) Patent No.: US 11,061,373 B1
(45) Date of Patent: Jul. 13, 2021

(54) METHOD AND SYSTEM FOR CALCULATING PROBABILITY OF SUCCESS OR FAILURE FOR A LITHOGRAPHIC PROCESS DUE TO STOCHASTIC VARIATIONS OF THE LITHOGRAPHIC PROCESS

(71) Applicant: Mentor Graphics Corporation, Wilsonville, OR (US)

(72) Inventors: Gurdaman Khaira, Beaverton, OR (US); Germain Louis Fenger, Gladstone, OR (US); Azat Latypov, San Jose, CA (US); John L. Sturtevant, Portland, OR (US); Yuri Granik, Palo Alto, CA (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/545,601

(22) Filed: Aug. 20, 2019

(51) Int. Cl.
  *G05B 13/04* (2006.01)
  *G03F 7/20* (2006.01)
  *G05B 13/02* (2006.01)

(52) U.S. Cl.
  CPC ........... *G05B 13/042* (2013.01); *G03F 7/705* (2013.01); *G05B 13/0265* (2013.01)

(58) Field of Classification Search
  CPC .... G05B 13/042; G05B 13/0265; G03F 7/705
  See application file for complete search history.

(56) References Cited

U.S. PATENT DOCUMENTS 7,313,777 B1 * 12/2007 Yang ............... G06F 30/398
                                                        716/52
7,448,018 B2 * 11/2008 Heng ............... G06F 30/39
                                                        716/54

(Continued)

OTHER PUBLICATIONS

Adler, Robert J., and Taylor, Jonathan E. "Random Fields and Geometry". Section 11.1. Springer Science & Business Media, 2007.

(Continued)

*Primary Examiner* — Charles R Kasenge

(57) ABSTRACT

A method and system for calculating probability of success or failure for a lithographic process due to stochastic variations of the lithographic process are disclosed. Lithography is a process that uses light to transfer a geometric pattern from a photomask, based on a layout design, to a resist on a substrate. The lithographic process is subject to random stochastic phenomena, such as photon shot noise and stochastic phenomena in the resist process and resist development, with the resulting stochastic randomness potentially becoming a major challenge. The stochastic phenomena are modeled using a stochastic model, such as a random field model, that models stochastic randomness the exposure and resist process. The stochastic model inputs light exposure and resist parameters and definitions of success of success or failure as to the lithographic process, and outputs a probability distribution function of deprotection concentration indicative of success or failure probability of the lithographic process. In turn, the probability distribution function may be used to modify one or both of the light exposure and resist parameters in order to reduce the effect of stochastic randomness on the lithographic process.

17 Claims, 16 Drawing Sheets

(56) References Cited

U.S. PATENT DOCUMENTS

| | | | | |
|---|---|---|---|---|
| 7,962,865 | B2* | 6/2011 | Heng | G06F 30/39 |
| | | | | 716/53 |
| 9,651,856 | B2* | 5/2017 | Inoue | G03F 7/70516 |
| 9,934,346 | B2 | 4/2018 | Hansen | |
| 2008/0250382 | A1* | 10/2008 | Kumashiro | G03F 7/70616 |
| | | | | 716/50 |
| 2008/0301624 | A1* | 12/2008 | Heng | G06F 30/39 |
| | | | | 716/55 |
| 2015/0067628 | A1 | 3/2015 | Torres | |
| 2016/0292348 | A1 | 10/2016 | Lei | |
| 2017/0010538 | A1 | 1/2017 | Hansen | |
| 2017/0285490 | A1 | 10/2017 | Lam | |
| 2018/0196349 | A1 | 7/2018 | Liu | |
| 2019/0102501 | A1 | 4/2019 | Sturtevant | |
| 2019/0311071 | A1* | 10/2019 | Liu | G06F 7/58 |
| 2019/0317412 | A1* | 10/2019 | Mos | G03F 7/70616 |

OTHER PUBLICATIONS

Botev, Zdravko I. "The normal law under linear restrictions: simulation and estimation via minimax tilting." Journal of the Royal Statistical Society: Series B (Statistical Methodology) 79.1 (2017): 125-148.

De Bisschop, P., and Hendrickx, E. "Stochastic printing failures in EUV lithography." Extreme Ultraviolet (EUV) Lithography X. vol. 10957. International Society for Optics and Photonics, Mar. 26, 2019.

Genz, Alan. "Numerical computation of multivariate normal probabilities." Journal of computational and graphical statistics 1.2 (1992): 141-149.

Luo, Yandong, and Gupta, Puneet. "Relaxing LER requirement in EUV lithography." Design—Process—Technology Co-optimization for Manufacturability XII. vol. 10588. International Society for Optics and Photonics, Mar. 20, 2018.

Su, Xiaojing et al. "Probability prediction model for bridging defects induced by combined influences from lithography and etch variations," J. Micro/Nanolithography, MEMS, and MOEMS 18(2), 023503 (2019).

Vaglio Pret, Alessandro, et al. "Non-Gaussian CD distribution characterization for DRAM application in EUV lithography." International Conference on Extreme Ultraviolet Lithography 2018. Proceedings of the SPIE, vol. 10809. International Society for Optics and Photonics, 2018.

Vaglio Pret, Alessandro, et al. "OPC strategies to reduce failure rates with rigorous resist model stochastic simulations in EUVL" Society of Photo-Optical Instrumentation Engineers (SPIE) Conference Series. vol. 10957. 2019.

Van der Vaart, A. W. "Asymptotic statistics." Section 2.18. vol. 3. Cambridge University Press, 2000.

* cited by examiner

- target polygons 802
- iNtegrity set, $N$ 804
- iSolation set, $S$ 806

METHOD AND SYSTEM FOR CALCULATING PROBABILITY OF SUCCESS OR FAILURE FOR A LITHOGRAPHIC PROCESS DUE TO STOCHASTIC VARIATIONS OF THE LITHOGRAPHIC PROCESS

FIELD

The present disclosure relates to the field of circuit design and manufacturing, and specifically relates to determining success or failure for a lithographic process due to stochastic variations of the lithographic process.

BACKGROUND

Electronic circuits, such as integrated microelectronics, are used in a variety of products, from automobiles to microwaves to personal computers. Designing and fabricating integrated circuits (IC) typically involves many steps, sometimes referred to as a "design flow." The particular steps of the design flow often are dependent upon the type of integrated circuit, its complexity, the design team, and the integrated circuit fabricator or foundry that will manufacture the IC. Typically, software and hardware "tools" verify the design at various stages of the design flow by running software simulators and/or hardware emulators. These steps aid in the discovery of errors in the design, and allow the designers and engineers to correct or otherwise improve the design.

For example, a layout design may be derived from an electronic circuit design. The layout design may comprise an IC layout, an IC mask layout, or a mask design. In particular, the layout design may be a representation of an integrated circuit in terms of planar geometric shapes that correspond to the patterns of metal, oxide, or semiconductor layers, which make up the components of the integrated circuit. The layout design can be one for a whole chip or a portion of a full-chip layout design.

Lithography is a process used to manufacture electronic circuits in which light is used to transfer a geometric pattern from a photomask, based on the layout design, to a silicon substrate by a photo-sensitive polymer. The polymer contains certain functional groups which get cleaved due to chemical reactions caused by exposure to light (deprotection) and hence affects the polymer's solubility during development and thus creating a mask for the subsequent etching process. Various types of lithography processes are used, including deep ultraviolet (DUV) lithography or extreme ultraviolet (EUV) lithography. In DUV or EUV lithography, one or more stochastic phenomena may manifest themselves, such as line edge roughness or critical dimension (CD) non-uniformity. In more extreme cases, the stochastic phenomena may lead to stochastic pinching or bridging of the patterned features, resulting in potential failure of the electronic circuit.

DUV lithography or EUV lithography may be subject to random stochastic phenomenon based on any one, any combination or all of: (1) photon shot noise; (2) stochastic phenomena in the resist process (e.g., photo-acid generator's (PAG) activation, acids/quencher molecules random walk and reactions, deprotection of the functional groups); or (3) stochastic phenomena in the resist development (e.g., dissolution of entangled partially deprotected polymer chains). While stochastic randomness effects both DUV and EUV lithography, the effects are more severe for EUV lithography due to lower average photon counts, resulting in stochastic randomness being one of the major challenges in EUV lithography.

Various methods seek to understand stochastic randomness. As one example, experimental measurements are used whereby multiple instances of the pattern of interest are exposed and measured, with identical exposure, development and measurement settings. The experimental measurements are then analyzed to calculate various metrics related to the success or failure frequency of the lithographic process outcome (e.g., pinching/bridging frequency, other failure frequency, CD variation histograms, etc.).

As another example, Monte Carlo simulations are performed using stochastic rigorous models of exposure and resist processes. Specifically, multiple simulation runs (e.g., simulation trials) are run with identical exposure, development and simulated metrology settings, differing by the random seed factors used in the stochastic simulator. The outcomes of these random simulation trials are then analyzed to calculate various metrics related to the success or failure frequencies of the lithographic process outcome. In particular, to optimize the mask in order to mitigate the effects of randomness, for each iteration on the mask, Monte Carlo simulations are run to estimate the probability of lithographic failures due to stochastic effects. The mask is then optimized, from one iteration to another, to reduce such estimate of failure probability.

SUMMARY

In one embodiment, a method, executed by at least one processor of a computer, of improving a lithographic process for imaging a portion of a layout design onto a substrate is disclosed. The method includes: accessing a random field model configured to model stochastic randomness in one or both of exposure or resist process, the random field model configured to receive inputs to at least one light exposure parameter, at least one resist model parameter associated with resist used in the lithographic process, and at least one success or failure criterion, the random field model configured to generate a probability distribution function of deprotection concentration indicative of success or failure probability of the lithographic process; inputting the at least one light exposure parameter, the at least one resist model parameter, and the at least one success or failure criterion to the random field model; outputting, using the random field model, the indication of the success or the failure probability of the lithographic process; and modifying at least one aspect in the lithographic process in order to reduce an effect of the stochastic randomness in the lithographic process.

In another embodiment, one or more non-transitory computer-readable media are disclosed. The one or more non-transitory computer-readable media store computer-executable instructions for causing one or more processors performance of a method comprising: accessing a random field model configured to model stochastic randomness in one or both of exposure or resist process, the random field model configured to receive inputs to at least one light exposure parameter, at least one resist model parameter associated with resist used in a lithographic process, and at least one success or failure criterion, the random field model configured to generate a probability distribution function of deprotection concentration indicative of success or failure probability of the lithographic process; inputting the at least one light exposure parameter, the at least one resist model parameter, and the at least one success or failure criterion to the random field model; outputting, using the random field model, the indication of the success or the failure probability of the lithographic process; and modifying at least one aspect in the lithographic process in order to reduce an effect of the stochastic randomness in the lithographic process.

In still another embodiment, a system is disclosed. The system comprises one or more processors, with the one or more processors programmed to perform: accessing a random field model configured to model stochastic randomness in one or both of exposure or resist process, the random field model configured to receive inputs to at least one light exposure parameter, at least one resist model parameter associated with resist used in a lithographic process, and at least one success or failure criterion, the random field model configured to generate a probability distribution function of deprotection concentration indicative of success or failure probability of the lithographic process; inputting the at least one light exposure parameter, the at least one resist model parameter, and the at least one success or failure criterion to the random field model; outputting, using the random field model, the indication of the success or the failure probability of the lithographic process; and modifying at least one aspect in the lithographic process in order to reduce an effect of the stochastic randomness in the lithographic process.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

FIG. 11A is the edge's location from 100,000 random intensities, with the upper and lower bounds for the edge's location for α=3.

DETAILED DESCRIPTION OF EMBODIMENTS

General Considerations

Figure 1:
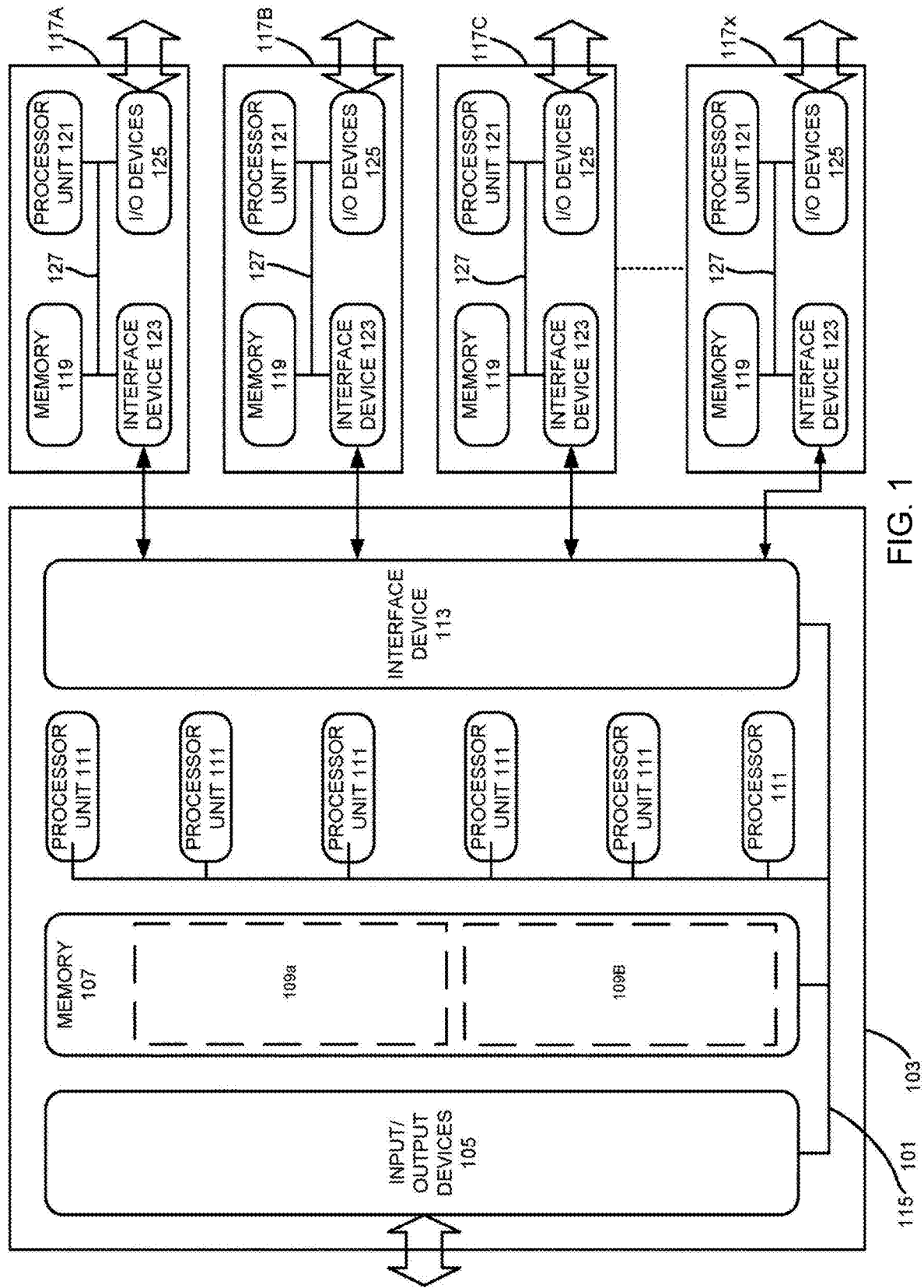
FIG. 1 illustrates an example of a computing system that may be used to implement various embodiments of the disclosed technology.

Various aspects of the present disclosed technology relate to techniques for modeling stochastic randomness in the exposure and resist process in order to improve (or optimize) illumination and/or mask used in a semiconductor manufacturing process, thereby reducing the effects of stochastic randomness on the yield of the lithographic process. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on one or more non-transitory computer-readable media, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "generate," "access," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input/output devices 105 and a memory 107. The input/output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations, such as the operations disclosed herein. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
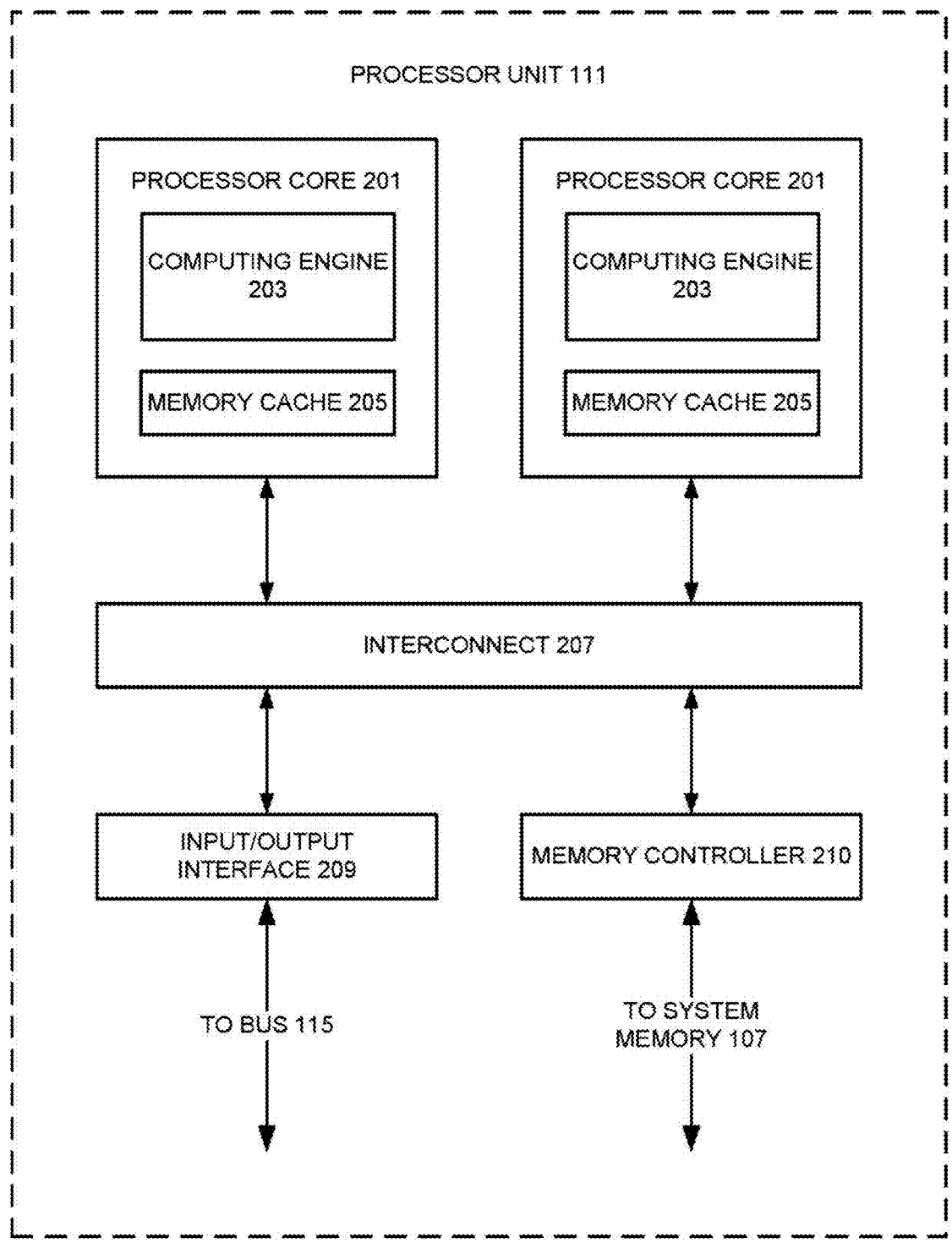
FIG. 2 illustrates an example of a multi-core processor unit that may be used to implement various embodiments of the disclosed technology.

With some implementations of the disclosed technology, the master computer 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RANI), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Stochastic Modeling

Lithography may comprise patterning layers for semiconductor dies. As discussed above, random stochastic phenomena may affect lithography, particularly EUV lithography, resulting in defects in the semiconductor dies. As discussed in the background, one solution to determine the effect of the random stochastic phenomena is to perform Monte Carlo simulations. In particular, potentially millions of different Monte Carlo simulations, with random seeds encoding the locations where the individual photons are absorbed in the resist film, may be run. The random seeds serve as starting points for random number generators to simulate small random variations. Millions of the simulations, which are performed for a large portion of the layer (and not merely for the critical portions), result in success or failure, thereby generating a distribution of success or failure. This procedure to perform millions of simulations is very computationally expensive.

In contrast, in some embodiments, rather than running Monte Carlo simulations, a stochastic model is generated. The stochastic model may model one or more stochastic phenomena including any one, any combination, or all of: photon shot noise (e.g., random absorbed photon density); stochastic phenomena in the resist process or other chemical stochastic process; stochastic phenomena in the resist development (e.g., for a variety of resist processes, including using chemically amplified resists (CAR) or non-CAR, such as MOx). As discussed in further detail below, it may be assumed that the absorbed photons follow a Poisson distribution. The stochastic randomness of the locations as to where the photons are absorbed may comprise one manner of addressing stochastic phenomena, such as discussed with regard to FIG. 5B below. Likewise, other stochastic phenomena may be considered, such as stochastic phenomena after the photons are absorbed. As one example, stochastic phenomena related to one or more chemical processes, such as chemical stochastic phenomena including chemical noise (e.g., secondary electron diffusion noise in EUV resist, PAGs activation, acid diffusion/reaction), may likewise be considered by the stochastic model. As another example, stochastic phenomena in the resist development may also be considered by the stochastic model.

The stochastic model, which may comprise a continuous random field model, may be defined with its distribution parameters calculated from the known image intensity in resist and one or more parameters of the resist process. The stochastic model may thus receive one or more inputs (e.g., (1) light exposure parameter(s); (2) resist model parameter(s); and (3) success/failure criteria) and generate one or more outputs indicating the probability of success or failure of at least a part of the layer. For example, the stochastic model may determine the success or failure of critical sections of the layer identified as particularly susceptible to failure. In this way, the stochastic model may: (i) provide a computationally efficient way to calculate the success or failure probability of the outcome of the lithographic process with respect to the stochastic randomness in exposure and the resist process; and/or (ii) enable the improvement (or optimization) of the illumination (e.g., source) and/or the mask (e.g., with regard to source-mask optimization (SMO) or optical proximity correction (OPC) algorithms) in order to reduce or mitigate the effects of stochastic randomness on the yield of the lithographic process. Examples of lithographic processes are disclosed in US Patent Application Publication No. 2015/0067628 A1 and US Patent Application Publication No. 2019/0102501 A1, both of which are incorporated by reference in their entirety.

Thus, the stochastic model may efficiently identify certain critical sections prone to failure (based on the determined probability of success/failure) in order to modify one or both of the intensity (or other light exposure parameter) or the resist (such as the pattern in the layout design) to reduce the possibility of failure. Further, the probability generated by the stochastic model may be included as a factor (along with one or more other factors) in a lithographic cost function for the source and/or mask optimization algorithms, as discussed further below.

Various stochastic models are contemplated, including without limitation a continuous random field model, a Gaussian random field model, and a multivariate normal distribution model. Other stochastic models are contemplated. With regard to the continuous random field model, a final outcome of the random stochastic processes associated with the lithographic process, including random stochastic processed related to any one, any combination or all of the resist exposure, resist processing and resist development, may be described as a certain random field. As one example, a random field is a term for a stochastic process with at least one restriction on its index set. Using the continuous random field model, the distribution parameters of the random field may be efficiently calculated from the known intensity of the image in resist and the parameters of the resist process. As one example, the continuous random field model may be used to consider one or more stochastic phenomena (e.g., random absorbed photon density, chemical stochastic phenomena, or resist development) and/or model complicating factors, such as one, any combination, or all of: (1) resist saturation effects related to the resist may be considered by the stochastic model, including with regard to photoacid generators (PAGs), other acids/quenchers, or the like for the resist; (2) development/3D effects; or (3) reaction-diffusion non-linearity during post exposure bake (PEB). Other model complicating factors are contemplated as well.

With regard to the Gaussian random field model, the Central Limit Theorem (CLT) may be used to accurately approximate the concentration of deprotection resulting from the resist exposure by a Gaussian random field (GRF), which is a type of random field involving Gaussian probability density functions of the variables. For example, the GRF model may be used when considering certain types of stochastic phenomena, such as random absorbed photon density (without potentially considering resist saturation effects). Using the Gaussian random field model, one or more parameters of the GRF (e.g., the mean and/or the covariance function) may be calculated from the known intensity of the image in resist and the parameters of the resist process. In particular, the GRF model may be defined by the mean function and a two-point covariance function.

With regard to the multivariate normal (MVN) distribution model, various critical portions of the layer, such as a finite set of observation points, may be subject to analysis. As such, the outcome of the resist exposure process may be quantified as the set of values of deprotection concentration sampled at the finite set of observation points (also referred to as "sampling points" or "pixels" or "voxels") in the resist film. Application of CLT to deprotection concentration sampled at these sampling points may yield that the random vector composed of the values of deprotection concentrations at these sampling points is distributed as a multivariate normal (MVN) distribution, which is a generalization of the one-dimensional normal distribution to higher dimensions. Using the MVN distribution model, one or more parameters (e.g., the mean vector and/or the covariance matrix) of this MVN may be calculated from the known intensity of the image in resist and the parameters of the resist process. In particular, the MVN distribution model may be defined by the mean vector and a symmetric positively semi-definite covariance matrix, which may be determined by performing a calibration based on a set of experimental measurements.

Further, as discussed above, separate from generating the stochastic model representing the deprotection concentration, at least a part of the lithographic process, such as one or more lithographically significant events, may be defined in terms of success or failure criteria of the lithographic process. In some embodiments, the lithographically significant events may be defined as a set of certain equality or inequality conditions in terms of any values, derivatives or their functionals, derived from the parameters of the stochastic model, such as the random field model, described above.

In particular, for a respective lithographic event, success and/or failure may be defined based on a determined outcome of the respective lithographic event. Example determined outcomes of lithographic events include any one, any combination, or all of: determination as to whether pinching or bridging has occurred; determination as to whether the lithographic process results in the complete removal of the resist material in a defined area; determination as to whether the lithographic process results in the complete retention of the resist material inside another defined area). Further, the outcome of the lithographic events, which may define success or failure, may be analyzed in one of several ways. For example, the outcome of the lithographic event may be determined using a cutline (or other shaped defined geometric shape. As another example; the outcome of the lithographic event may be dependent on defined sets, such as a defined isolation set(s) in which success is defined as the complete retention of the resist material therein and/or a defined integrity set(s) in which success is defined as the complete removal of the resist material therein; etc.

In this way, determination of the outcome of the lithographic events may comprise determining resist removal (such as complete resist removal) at one or more user-defined areas and/or resist retaining (such as complete retention of the resist material at one or more other user-defined areas. In particular, the success or failure criteria may be defined as a set of inequalities expressing a complete removal of the resist material at certain user-defined areas, $V_D$, in the resist, and a complete retention of the resist material at certain other user-defined areas, $V_P$. As discussed above, one type of stochastic model comprises a Gaussian random field model. In such a model, the inequalities may state that the deprotection concentration exceeds the resist removal threshold everywhere in $V_D$ (the user-defined areas for complete removal of the resist material) and the same deprotection concentration is less than the resist removal threshold everywhere in $V_P$ (the user-defined areas for complete retention of the resist material).

One success criterion comprises gauge critical dimension (CD)-based success criterion. In particular, one definition of the lithographically significant event, which constitutes a success of the lithographic process, is based on using a cutline (e.g., a gauge or other defined geometric shape) CD-based success criterion. In such a methodology, the cutline (e.g., the gauge or other defined geometric shape) is placed on a certain part of the pattern, such as a critically important part of the pattern, with the success or failure dependent on the removal or retention of the resist material at one or more defined points (such as one or more user-defined points) along the cutline. Various cutlines are contemplated, including a single line that cuts across the critically important part of the pattern. Illustrations and the verification of success probabilities computed using the gauge CD-based success criterion against the Monte Carlo simulations are discussed in more detail below.

Another definition of a lithographically significant event (typically constituting a failure of the lithographic process) is based on using the cutline (e.g., gauge or other defined geometric shape) as a detector of pinching or bridging. In such an instance, the cutline (e.g., gauge or other defined geometric shape) is placed at the expected location of the pinching or bridging, and the complete removal or complete retention of the resist along at least a part of the cutline (such as along the entire gauge) is used as a criterion for pinching/bridging occurring at the location of the gauge. Illustrations and the verification of success probabilities computed using the gauge based pinching or bridging failure criterion against the Monte Carlo simulations are discussed in more detail below.

Still another definition of the lithographically significant event is based on one or both of integrity set(s) or isolation set(s). For example, the integrity set(s) and/or isolation set(s) may be defined by applying, respectively, negative/positive bias to the target polygons and taking, respectively, the interior/exterior of the resulting biased polygons. After the integrity/isolation sets are defined, the success criterion of the lithographic process may be defined as a certain defined measure of (e.g., such as a complete) removal of the resist material inside the integrity set(s) and/or as another defined measure of (e.g., such as the complete) retention of the resist material inside the isolation set(s).

As discussed above, after generating the stochastic model and defining the success and/or failure criteria, the success and/or failure probability may be calculated. The calculation of the success and/or failure probability may generate one or more types of probability functions, such as a probability density function or a cumulative distribution function. For example, using the definition of success or failure defined above and using the knowledge of the distribution parameters of the stochastic model (e.g., the distribution parameters of the continuous random field model described above, for instance), one or more types of distribution functions, such as the probability density function or the cumulative distribution function may be generated to calculate the probability of interest. A probability density function, also known as a density of a continuous random variable, is a function whose value at any given sample (or point) in the sample space (the set of possible values taken by the random variable) multiplied by the measure (e.g., a length or a volume) of a small area surrounding this sample (e.g., point) is equal to the probability of the random variable assuming its values within this small area. The cumulative distribution function of a real-valued random variable, or simply the distribution function of X, evaluated at x, is the probability that X will take a value less than or equal to x.

Thus, various methodologies may be used to calculate the probability of interest. In some embodiments, a multivariate normal distribution cumulative distribution function (MVNCDF) may be used. In particular, MVNCDF, which may be considered an extension of a cumulative distribution function to the multidimensional case, may be used to calculate the success or failure probabilities of lithographically significant events defined as described above. Efficient algorithms for calculating MVNCDF may be found in both of the following, incorporated by reference herein in their entirety: Alan Genz and Frank Bretz. Computation of Multivariate Normal and t Probabilities. Springer (2009). ISBN 978-3-642-01689-9; Botev, Z. I., "The normal law under linear restrictions: simulation and estimation via minimax tilting", *Journal of the Royal Statistical Society, Series B* (2016), arXiv: 1603.04166.

In other embodiments, a Mahalanobis distance and the probability of the statistical interval bound by the Mahalanobis distance may be used. In particular, instead of calculating the probability using the MVN distribution model using MVNCDF (as described above), one may calculate the Mahalanobis distance, which is a measure of the distance between a point P and a distribution D, associated with the MVN distribution model. This Mahalanobis distance may be calculated between the MVN distribution and the deterministic (non-random) state (e.g., "a point") of the system corresponding to the successful lithographic outcome, as described above (e.g., where the definition of success or failure is a zero deprotection concentration for the sampling points, where the resist is to be retained, and a certain user-defined value of deprotection concentration exceeding a deprotection threshold for the sampling points, where the resist is to be removed). Although the Mahalanobis distance calculated in this manner does not directly correlate to the probability of the successful outcome, the Mahalanobis distance may be indicative of the probability. For example, the higher/lower values of this Mahalanobis distance may signal lower/higher probabilities of the success or failure. Thus, the Mahalanobis distance may be used as a metric indicating the improvement of the success probability. Furthermore, the value of the Mahalanobis distance may be used to provide an estimate of such probability using the inverse of the quantile function (which may specify the value of the random variable such that the probability of the variable being less than or equal to that value equals the given probability) for the $\chi^2$ distribution with the appropriate number (e.g., "k") of degrees of freedom (e.g., the distribution of a sum of the squares of "k" independent standard normal random variables). Using the Mahalanobis distance and the inverse of the quantile of the chi-squared distribution is less computationally expensive than other calculations, such as the calculation of MVNCDF.

In still other embodiments, Machine Learning (ML) methodologies may be used to quickly estimate the success or failure probability. For example, various regression techniques practiced in ML may be applied to provide a computationally efficient method to calculate the success/failure probability based on a continuous random field model (as discussed above), the definition of the success/failure criteria (as discussed above) and ML training datasets. The ML training datasets may be multiple exemplar combinations of relevant instances of inputs, including different stochastic models (e.g., continuous random field model; Gaussian random field model; MVN distribution model) and of different definitions of success/failure criteria (e.g., in terms of resist removal/retention, such as gauge CD-based success criterion, gauge-based pinching or bridging criterion, integrity/isolation sets criterion) along with the corresponding probabilities (outputs). For instance, for the MVN model, an artificial neural network (which may comprise a framework for the machine learning methodology) or a support vector machine (which may comprise a set of related supervised learning methods used for classification and regression) may be used to build a regression model using training sets generated using one of the implementations of the MVNCDF function. After such regression model has been trained, it may be used to perform the probability calculation instead of the MVNCDF function, discussed above, potentially resulting in faster computational performance.

In yet other embodiments, Rice's formula may be used to quickly estimate the average number of defects or the probability of a defect. Rice's formula, which gives the average number of times an ergodic stationary process considered within a certain interval crosses a fixed level u, thus providing an exact expression for the expectation (e.g., a mean or an average) of the number of up-crossings above a given threshold for a continuous random process. As discussed above, the random process may comprise a continuous random field or a Gaussian random field representing the deprotection concentration and sampled along a certain curve. Such curve, for instance, may be selected to be a straight line parallel to a line in a periodic lines and spaces array, and positioned at the middle of this line. The number of up-crossings of the deprotection concentration above the deprotection threshold may provide the approximation of the number of pinching defects across this line. Strictly speaking, such count is a count of the number of times the midpoint of the line is deprotected, which merely approximates the number of pinchings. Nevertheless, lithography errors may be based on the estimation of the lines and spaces failure rate or the lines and spaces defect densities based on counting the number of deprotections of the line or a space midpoint.

One manner of using Rice's formula to estimate the average number of defects may be based on the "pixel not OK" (pixNOK) metric, which may represent the failure probability according to the following: pixNOK=Σpixels in failure/Σpixels inspected. In the case of the pixNOK metric (or a number of defects), the random process in question may comprise the value of deprotection concentration along the middle of the line (of a periodic LS array). In the framework of a simplistic resist model, this particular process is a stationary Gaussian process with a constant mean and a constant variance. Its realizations (e.g., sampling paths) are smooth functions, because they result from convolutions of absorbed photon density (e.g., delta functions centered at the sites of photon absorptions) and a smooth simplistic resist model kernel. Such convolution is as smooth as the kernel of the simplistic model, which is typically a Gaussian function.

In such a situation, Rice's formula for a Gaussian process (not necessarily stationary) with a zero mean and a constant unit variance (not restrictive requirements) is as follows:

$$\mathbb{E}\{N_u^+(0, T)\} = \frac{e^{-u^2/2}}{2\pi} \int_0^T \lambda_t^{1/2} dt \qquad (1)$$

where $\lambda_t$ is the variance of the process derivative, $f'(t)$. The variance of the process derivative with regard to process of interest (e.g., deprotection concentration sampled along the middle of the line) may be calculated from the known image and the kernel of the simplistic resist model in the same manner as the variance of deprotection itself is calculated. In particular, such a derivative of the process is equal to a convolution of absorbed photon density (e.g., delta functions centered at the sites of photon absorptions) and a derivative of the simplistic resist model kernel. The variance of the process derivative may thus be calculated from the same variance formula as the model establishes for the process itself, with the kernel replaced by its derivative along the middle of the line. In this way, the expectation of the number of defects may be calculated using Rice's formula, including the random processes sampled along the non-periodic lines and spaces, bending lines and spaces, sampled across the feature (e.g. across the line or a space), or sampled across a via/contact hole diameter.

Thus, any one, any combination, or all of the following may improve analysis (including significant reduction in runtime) of potential errors in the lithographic process due to stochastic phenomena including: (a) using an ad hoc statistical model of the stochastic phenomena in the exposure and the resist process (e.g., the continuous random field model, the Gaussian random field model, or the MVN distribution model); (b) defining the success/failure of lithographic events in ways allowing the use of probability distribution functions of the statistical models to calculate the respective probabilities; and (c) calculating the success/failure probabilities analytically or semi-analytically, based on the model and the events definitions in (a) and (b). In this way, the methodology makes it practical to calculate the success/failure probability in one, some, or every iteration of the multiple iterations of the SMO, OPC or verification algorithms for the entire die of the integrated circuit. This is unlike typical analysis methodologies, such as based on Monte Carlo, that make the use of experimental exposures and measurements in multiple iterations of the mask preparation flow impractical. Rather, calculating the success/failure probability for the entire chip/die within a reasonable time allows quick verification of the OPC/SMO solutions and to calculate the OPC/SMO solutions, thereby reducing the probability of stochastic failure and improving the yield, particularly in the EUV lithography.

In one implementation of OPC, the mask pattern is modified (such as iteratively modified) in order to produce the mask pattern yielding the optimal process result with regard to a certain criterion (e.g., the least edge placement error or the least failure probability). An example of OPC is disclosed in US Patent Application Publication No. 2016/0292348, incorporated by reference herein in its entirety.

In one implementation, in SMO, the mask pattern, illumination mode and potentially exposure dose are modified (such as iteratively modified) to produce the optimal process result (e.g., the least edge placement error or the least failure probability). An example of SMO is disclosed in US Patent Application Publication No. 2015/0067628, incorporated by reference herein in its entirety.

The methodology disclosed further enables substantial reduction in the prohibitively significant run time requirements needed for typical analytical methodologies, such as Monte Carlo trials. The methodology disclosed herein, such as using a MVNCDF based methodology, may produce comparable results to Monte Carlo trials for the success/failure probabilities calculated. For example, a success/failure probability of $5.0 \times 10^{-6}$ or less may require 1 to 2 million Monte Carlo simulations, and may take on the order of 5 hours of run time (using a typical modern CPU). In contrast, calculating the same probability using the MVNCDF methodology as disclosed herein may take approximately from 10 to 50 seconds for the same test cases, demonstrating a reduction of the runtime by a factor of 360 to 1800. In this way, the methodology disclosed herein may result in a very significant reduction in runtimes over prior typical methodologies.

Figure 3:
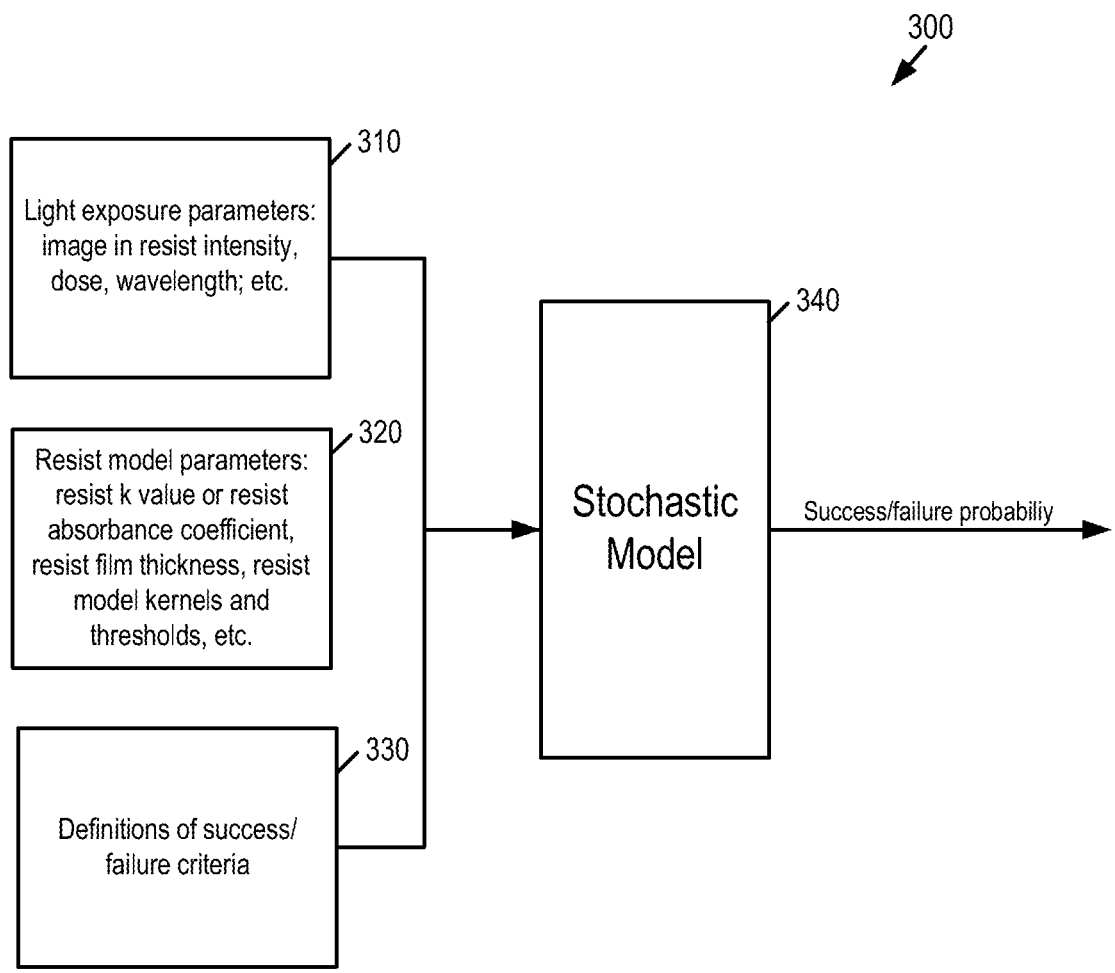
FIG. 3 illustrates a block diagram of inputs to and output(s) from the stochastic model.

Referring back to the figures, FIG. 3 illustrates a block diagram 300 of inputs to and output(s) from the stochastic model 340. As discussed above, the stochastic model may receive one or more inputs, including any one, any combination or all of: one or more light exposure parameters 310 (e.g., any one, any combination, or all of: image in resist intensity; dose; wavelength); one or more resist model parameters 320 (e.g., any one, any combination, or all of: resist k (extinction coefficient) value or resist absorbance coefficient; resist film thickness; resist model kernels and thresholds); and definition(s) of success and/or failure criteria 330 (e.g., using a cutline; defining isolation set(s) in which success is defined as the complete retention of the resist material therein; defining integrity set(s) in which success is defined as the complete removal of the resist material therein; etc.). Further, the output of the stochastic model 340 may comprise success and/or failure probability (e.g., a probability distribution function).

Figure 4:
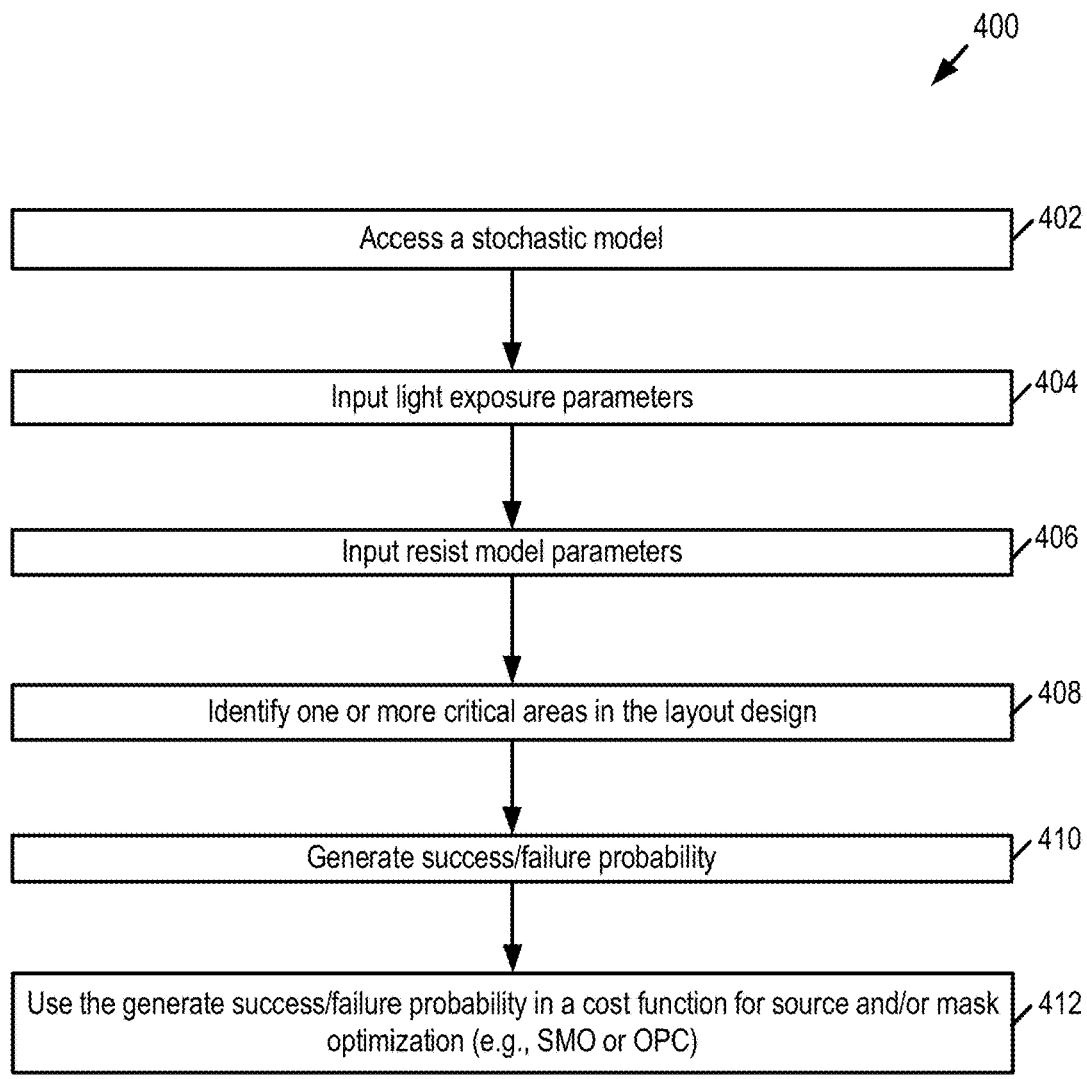
FIG. 4 is a flow diagram of generating and using the success/failure probability using the stochastic model.

FIG. 4 is a flow diagram 400 of generating and using the success/failure probability using the stochastic model. At 402, the stochastic model is accessed. At 404, light exposure parameters, such as discussed above, may be input to the stochastic model. At 406, resist model parameters are input to the stochastic model as well. At 408, one or more critical areas may be identified in the layout design. At 410, the success/failure probability, using the stochastic model and the various inputs, may be generated for the identified critical area(s). For example, a probability density function may be generated that defines deprotection at a collection of discrete points, such as in the one or more critical areas in the layout design.

At 412, the generated success/failure probability may be used in a cost function for one or both of source optimization or mask optimization. In optimizing the lithographic process, a cost function may be used. The cost function may take one of several forms suitable for the goal of optimization and represent one or more figures of merit (e.g., a metric of the system). An example of cost function analysis is disclosed in US Patent Application Publication No. 2015/0067628, incorporated by reference herein in its entirety. The optimization process may find one or more parameters of the system that optimizes (e.g., minimizes or maximizes) the cost function, under a certain constraint if any. When the cost function is optimized (e.g., minimized or maximized), the one or more figures of merit represented by the cost function are optimized (e.g., minimized or maximized). In a lithography apparatus, an example of a cost function comprises:

$$\text{Cost} = F * D \qquad (2)$$

where F equals the frequency of the pattern and D equals the printing difficult factor. In some implementations, the generated probability may be factored into the cost function, such as incorporated into D.

As discussed above, various stochastic models are contemplated. For example, a continuous random field model, a Gaussian random field model, or an MVN distribution model may be used. Further, success or failure of a lithographic event may be defined as deprotection along a line or a volume. In this way, using one of the stochastic models and the defined success or failure may be used to calculate the probability of the line or volume deprotection, which may be useful for failure rate estimation.

For background, for a given continuous image intensity in resist, I(x), and a given resist model kernel, G(x), a deprotection (e.g., a concentration of deprotected functional groups in the resist) may be modelled as:

$$n_d(x) = G(x) \otimes I(x) \qquad (3)$$

Figure 5A:
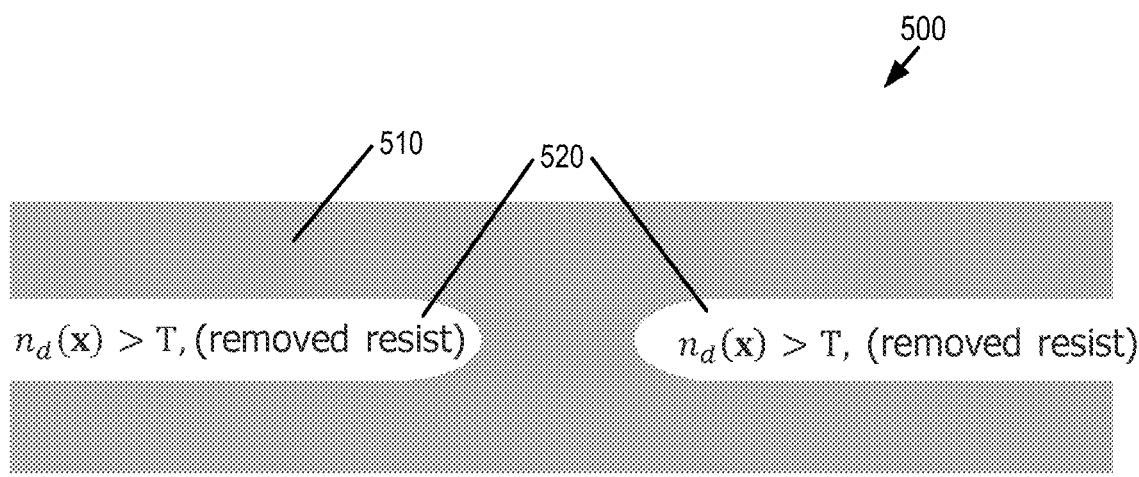
FIG. 5A illustrates a first resist representation without accounting for stochastic effects.

A simplistic resist development model, which does not account for stochastic phenomenon, is illustrated in the illustration 500 in FIG. 5A with retained resist 510 and removed resist 520. In particular, the simplistic resist development model, for a given development threshold T, may be represented as follows:

at points x where $n_d(x) > T$, the resist is removed (e.g., dissolved);
at points x where $n_d(x) < T$, the resist is retained;
the points x where $n_d(x) = T$ form the edge.

For purposes of illustration, the deprotected areas are etched into the isolating substrate and filled with the metal to form interconnects.

In accounting for simplistic stochastic exposure and the resist model, the result of the imaging model is I(x), a continuous image intensity in resist, defined at every point of the resist film. Using the given I(x), one may calculate the random absorbed photon density, resulting from the exposure by $N_{hv}$ photons as:

$$n_{hv}(x) = \sum_{i=1}^{N_{hv}} \delta(x - x_i) \qquad (4)$$

where the sites of absorbed photons, $x_i$, are selected to satisfy the photon absorption statistics (e.g., ~Poisson (<n>) for each voxel in the resist, with <n> denoting the average number of photons absorbed in this voxel). The stochastic deprotection resulting from these absorbed photons is:

$$n_d(x) = \sum_{i=1}^{N_{hv}} G(x - x_i) \qquad (5)$$

Figure 5B:
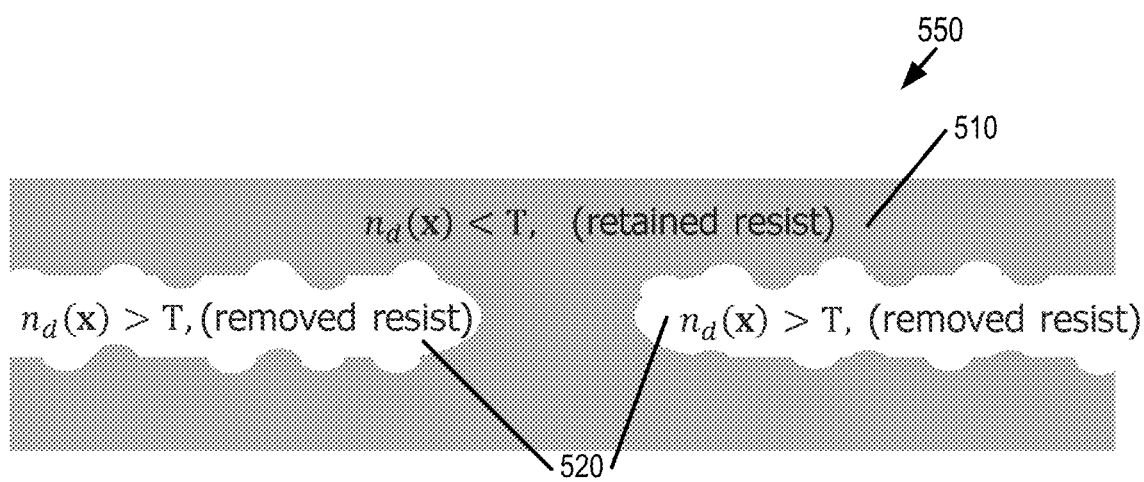
FIG. 5B illustrates the first resist representation accounting for stochastic effects.

The simplistic resist development model, which does account for at least some stochastic phenomenon, is illustrated in the illustration 550 in FIG. 5B. The simplistic resist development model assumes that each photon contributes equally to the process of making the resist dissolvable. Alternatively, the resist development model may consider other stochastic phenomena, such as chemical stochastic phenomena, and/or may consider other complicating factors, such as resist saturation effects, development/3D effects, or reaction-diffusion non-linearity. For example, with regard to resist saturation, the initial photons that fall onto the resist film may trigger the reaction without saturation effects; however, the later photons, which fall on the molecules that have already at least partly reacted to the light, may be subject to saturation resulting in the later photons potentially have less chemical effect.

As discussed in more detail below, using the above simplistic resist model and Central Limit Theorem (CLT), at any point in resist, the deprotection is distributed normally. The parameters of the normal distribution are discussed further below at Equations 41 and 42. Knowing this normal distribution, one may calculate various probabilities related to a resist deprotection. For example, one, some or all of the following probabilities may be calculated:

(i) $\Pr(n_d(x_0) > T)$: probability that a given point in the resist, $x_0$, is removed/dissolved.

(ii) all points in the resist, where the probability to be removed is greater than 99.7% (3-sigma), for each point.

(iii) all points in the resist, where the probability to be retained is 99.7% or greater (3-sigma), for each point.

The probabilities calculated are merely for illustration purposes; other probability calculations are contemplated. Further, estimating a probability of a simultaneous removal of a given set of points in the resist is based on the knowledge of the joint probability density for deprotection sampled in all of these points (e.g., covariances between spatially separated points, in addition to means and variances).

Figure 6A:
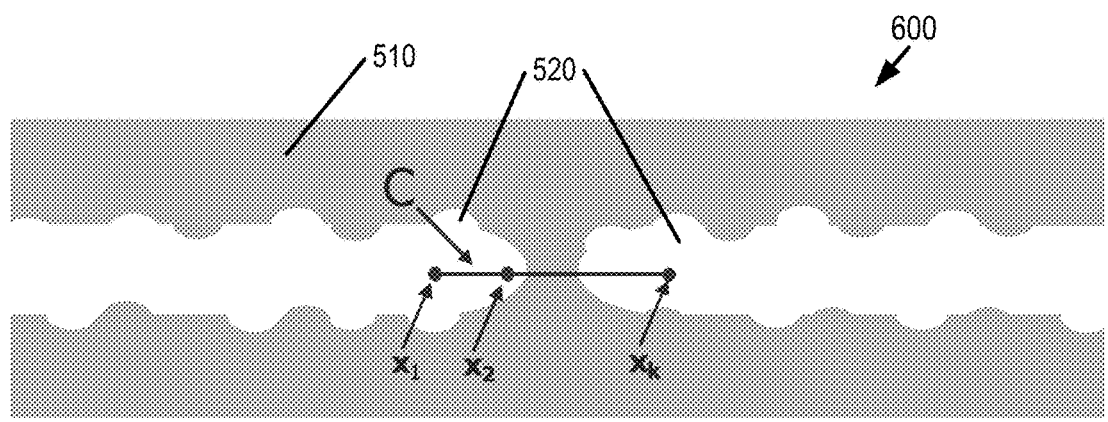
FIGS. 6A-B illustrate the first resist representation accounting for stochastic effects using a cutline C to determine whether pinching has not occurred (FIG. 6A) or whether pinching has occurred (FIG. 6B).
Figure 6B:
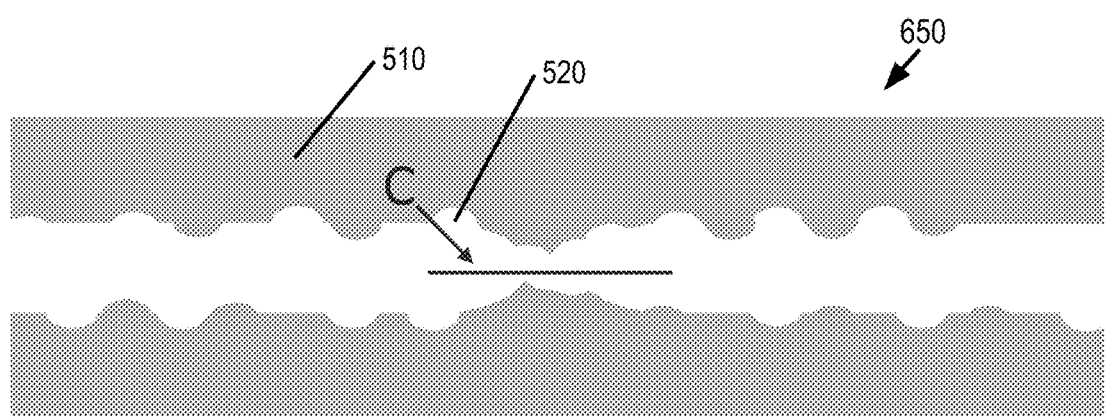

FIGS. 6A-B illustrate a first resist representation accounting for stochastic effects using a cutline C to determine whether pinching has not occurred (as shown in illustration 600 of FIG. 6A) or whether pinching has occurred (as shown in illustration 650 of FIG. 6B). The cutline, C, may be placed across a location, such as where the pinching probability is to be estimated. As discussed above, various parts of the layout may comprise critical sections or points. As shown in FIGS. 6A-B, the probability may be calculated at all points on a cutline C being fully deprotected, as represented by:

$$Pr(n_d(x) > T, \text{ for all } x \in C) \qquad (6)$$

This probability may be a reasonably good estimate as to whether pinching is occurring in the vicinity of the cutline. Further, calculating the probability may be based on knowledge of the joint probability density function for deprotection along the cutline.

Further, means and covariance of the deprotection function may be calculated for a set of points according to one or more of the following steps:

Step 1: Mean, Variance and Spatial Covariance of Deprotection Resulting from a Single Absorbed Photon Initially, means, variances and covariances of deprotection resulting from a single photon at a pair of observation points may be calculated. Specifically, the coordinates, X, of an absorption point for a single photon absorbed in a resist, within a simulation area V, form a 3-dimensional random vector with a probability density function given by:

$$f_x(x) = \beta \cdot \alpha(x) I(x), \qquad (7)$$

where $\beta = (\int_V \alpha(x) I(x) dx)^{-1}$ is a normalization constant, $\alpha(x)$ is absorption coefficient and $I(x)$ is the image intensity in resist. The values of deprotection from a single (e.g., the first) photon, $n_1^{(l)}$ and $n_1^{(m)}$, at any two observation points $x_l$ and $x_m$ are the deterministic (non-random) functions of this random photon absorption point X:

$$n_1^{(l)} = G(x_l - X) \qquad (8)$$

$$n_1^{(m)} = G(x_m - X)$$

Denoting by $\gamma$ either of the indices l or m, the means, variances and covariances of these two deprotection values may be written as follows:

$$E(n_1^{(\gamma)}) = \beta \int_V G(x_\gamma - x) \alpha(x) I(x) dx, \qquad (9)$$

$$\text{Var}(n_1^{(\gamma)}) = E((n_1^{(\gamma)})^2) - (E(n_1^{(\gamma)}))^2 = \beta \int_V G^2(x_\gamma - x) \alpha(x) I(x) dx - (\beta \int_V G(x_\gamma - x) \alpha(x) I(x) dx)^2 \qquad (10)$$

$$\text{Cov}(n_1^{(l)}, n_1^{(m)}) = E(n_1^{(l)} n_1^{(m)}) - E(n_1^{(l)}) E(n_1^{(m)}) = \beta \int_V G(x_l - x) G(x_m - x) \alpha(x) I(x) dx - (\beta \int_V G(x_l - x) \alpha(x) I(x) dx)(\beta \int_V G(x_m - x) \alpha(x) I(x) dx), \qquad (11)$$

where E( ), Var( ) and Cov( ) denote, respectively, the expectation (i.e. mean or average), variance and covariance of their arguments.

One may now consider k observation points in the simulation area V of the resist, $\{x_1, x_2, \ldots, x_k\}$, and the values of deprotection $n_1 = \{n_1^{(1)}, n_1^{(2)}, \ldots, n_1^{(k)}\}$ resulting in each of these points from a single (e.g. the first) photon absorbed in this simulation area. The equations 9, 10 and 11 provide the values of mean and variance of deprotection sampled at any of these observation points and the value of covariance for a pair of deprotection values sampled at any pair of these observation points.

Step 2: Mean, Variance and Spatial Covariance Resulting from a Given Fixed Number of Absorbed Photons, Application of CLT Next, one may consider the deprotection values resulting from a given number, $N_{hv}$, of photons absorbed within the simulation area V. These values of deprotection are sampled at k observation points in the resist, $\{x_1, x_2, \ldots, x_k\}$. We denote $n_j = \{n_j^{(1)}, n_j^{(2)}, \ldots, n_j^{(k)}\}$ the values of deprotection resulting from the j-th absorbed photon ($1 \leq j \leq N_{hv}$) in the resist, and the following notation may be used:

$$n = \sum_{j=1}^{N_{hv}} n_j \qquad (12)$$

for the deprotection resulting from all $N_{hv}$ photons, sampled at the observation points. One may note that each photon is absorbed independently of other photons, and the coordinates X of the sites of absorption are independent identically distributed random variables with their common probability density given by equation 7. Correspondingly, the values of deprotection at the sampling points, resulting from each photon, given by equation 8, are independent identically distributed random variables as well. As a result, the mean, variance and spatial covariance values for deprotection resulting from all $N_{hv}$ photons may be given by:

$$E(n^{(\gamma)}) = N_{hv} E(n_1^{(\gamma)}) = \beta N_{hv} \int_V G(x_\gamma - x) \alpha(x) I(x) dx, \qquad (13)$$

$$\text{Var}(n^{(\gamma)}) = N_{hv} \text{Var}(n_1^{(\gamma)}) = \beta N_{hv} \int_V G^2(x_\gamma - x) \alpha(x) I(x) dx - N_{hv} (\beta \int_V G(x_\gamma - x) \alpha(x) I(x) dx)^2 \qquad (14)$$

$$\text{Cov}(n^{(l)}, n^{(m)}) = N_{hv} \text{Cov}(n_1^{(l)}, n_1^{(m)}) = \beta N_{hv} \int_V G(x_l - x) G(x_m - x) \alpha(x) I(x) dx - N_{hv} (\beta \int_V G(x_l - x) \alpha(x) I(x) dx)(\beta \int_V G(x_m - x) \alpha(x) I(x) dx), \qquad (15)$$

Furthermore, because each term in the sum of equation 12 represents an independent identically distributed random vector with a finite values of mean (in equation 9), variance (in equation 10) and covariance (in equation 11) of its components, the Central Limit Theorem (CLT) may be applied to the sum in equation 12.

As discussed above, the multidimensional CLT may be applied. Examples of descriptions for multidimensional CLT include the following (both of which are incorporated by reference in their entirety): https://en.wikipedia.org/wiki/Central_limit_theorem#Multidimensional CLT; Van der Vaart, A. W., Asymptotic statistics. New York: Cambridge University Press. ISBN 978-0-521-49603-2. LCCN 98015176 (1998) (see, e.g., Section 2.18). One skilled in the art may apply the teachings of the references for CLT. It follows from the CLT that, for a sufficiently large number of absorbed photons $N_{hv}$, the random vector n may be well approximated by a Multivariate Normal (MVN) distribution, $\mathcal{N}(\mu, \Sigma)$, with the value of its mean vector, $\mu$, given by equation 13 and the entries of its covariance matrix, $\Sigma$, given by equations 14 and 15.

Because the latter result is valid for any selection of any finite number of sampling points in resist, the continuous distribution of deprotection is a Gaussian Random Field.

Step 3: The Case when the Number of Absorbed Photons is a Poisson Distributed Random Variable (Fixed Average Exposure Dose)

Equations 13, 14 and 15 were obtained based on the assumption of absorption of a given fixed number of photons, $N_{hv}$, within the simulation area V. The actual exposure control mechanisms in optical or EUV lithography do not allow to ensure the absorption of the exact prescribed number of photons. These exposure control mechanisms usually allow the control of the intensity of light falling on the photomask and the duration of exposure (or the value of the scanning velocity). As a result, only the average number of absorbed photons (or the average dose) may be controlled by such exposure mechanisms. The actual number of absorbed photons within the simulation area V in such realistic exposure scenarios is a Poisson-distributed random variable, with the value of the rate parameter of this Poisson distribution equal to the average number of photons absorbed within the simulation area, $\overline{N_{hv}}$:

$$N_{hv} \sim \text{Poisson}(\overline{N_{hv}}). \tag{22}$$

The sum in the equation for a total deprotection (equation 12) therefore becomes a sum with a random (Poisson-distributed) number of independent identically distributed terms. As known to those skilled in the art of statistics and probability theory, the distribution of such sum is a compound Poisson distribution. The expressions for the mean, variance and covariance for the total deprotection (equation 12) may be obtained using the properties of the Poisson distribution and the formulae known as the law of total expectation, the law of total variance and the law of total covariance, known to those skilled in the art of statistics and probability theory. Application of these formulae gives, for the case of fixed average exposure dose:

$$E(n^{(\gamma)}) = \overline{N_{hv}} E(n_1^{(\gamma)}) = \beta \overline{N_{hv}} \int_V G(x_\gamma - x)\alpha(x)I(x)dx, \tag{23}$$

$$\text{Var}(n^{(\gamma)}) = \overline{N_{hv}} E((n_1^{(\gamma)})^2) = \beta \overline{N_{hv}} \int_V G(x_\gamma - x)\alpha(x)I(x)dx, \tag{24}$$

$$\text{Cov}(n^{(l)}, n^{(m)}) = \overline{N_{hv}} E(n_1^{(l)} n_1^{(m)}) = \beta \overline{N_{hv}} \int_V G(x_l - x)G(x_m - x)\alpha(x)I(x)dx. \tag{25}$$

After calculating the means and covariances of the normally distributed deprotection at the observation points, n, the joint probability density for the corresponding Multivariate Normal (MVN) distribution, $\mathcal{N}(\mu, \Sigma)$, may be written as:

$$f(n) = \frac{1}{\sqrt{(2\pi)^k \det(\Sigma)}} \exp\left(-\frac{1}{2}(n-\mu)^T \Sigma^{-1} (n-\mu)\right) \tag{26}$$

where the components of the parameters of this MVN distribution (the mean vector $\mu$ and the covariance matrix $\Sigma$) follow from equations 23 and 25:

$$\mu_\gamma = \beta \overline{N_{hv}} \int_V G(x_\gamma - x)\alpha(x)I(x)dx \tag{27}$$

$$\Sigma_{lm} = \beta \overline{N_{hv}} \int_V G(x_l - x)G(x_m - x)\alpha(x)I(x)dx. \tag{28}$$

With the known probability density function (PDF), one may calculate deprotection probability for a selected set of observation points as:

$$Pr(n > T) = \int_{n > T} f(n)dn \tag{29}$$

which essentially reduces to a calculation of a cumulative density function (CDF) for a multivariate normal distribution at a point n=T (all components of n are equal T). As discussed above, there are various ways to approximate the CDF of an MVN distribution. For example, the Mahalanobis distance between n and T may be used as an indicator to quickly estimate the probability of deprotection.

Figures 7A, 7B:
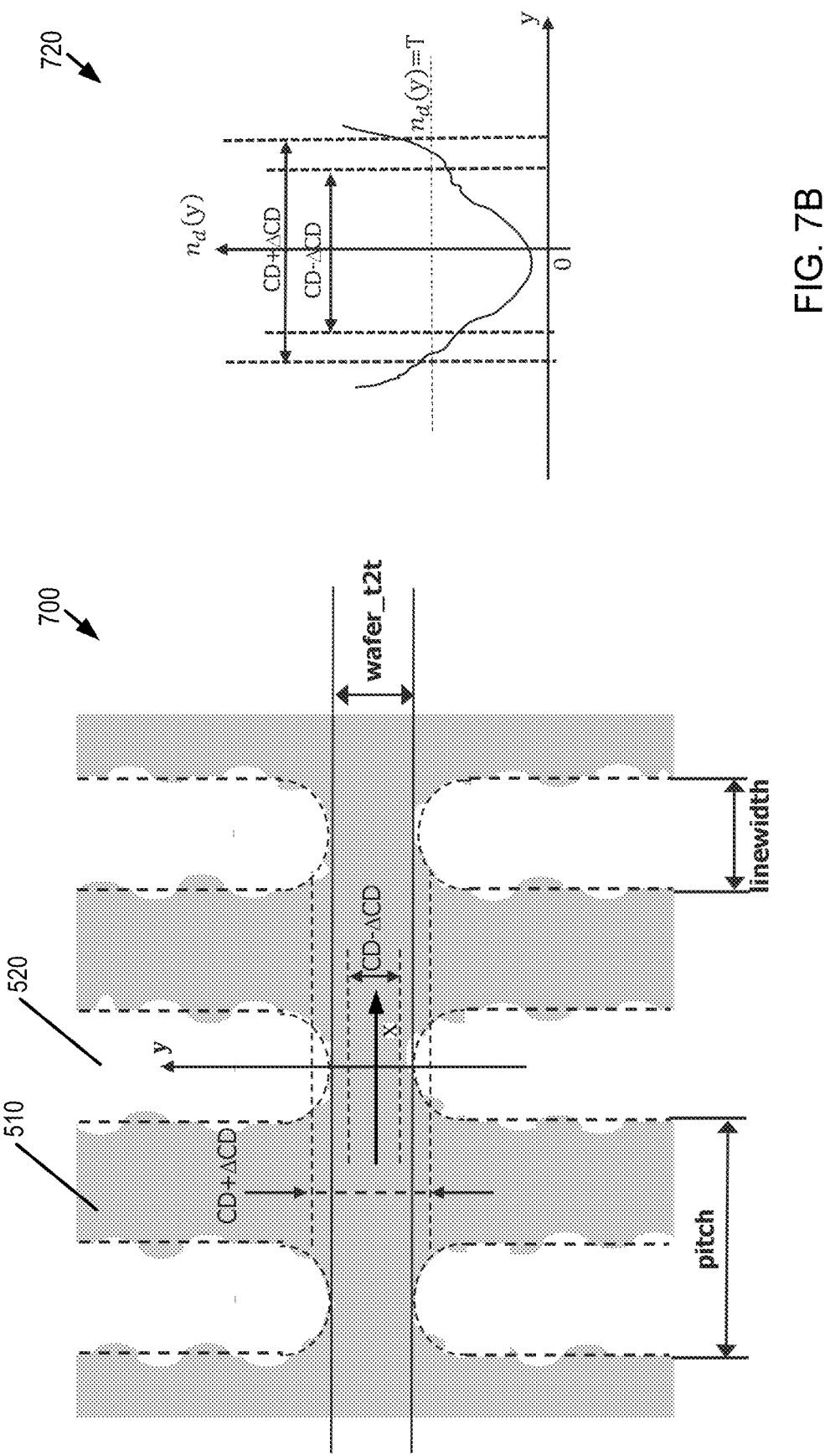
FIG. 7A is an illustration of a second resist representation of grouped lines with a tip-to-tip (t2t) gap and the t2t gauge critical dimension (CD).
FIG. 7B illustrates a graph correlated to the second resist representation of FIG. 7A of the CD-based success criterion.
Figure 7C:
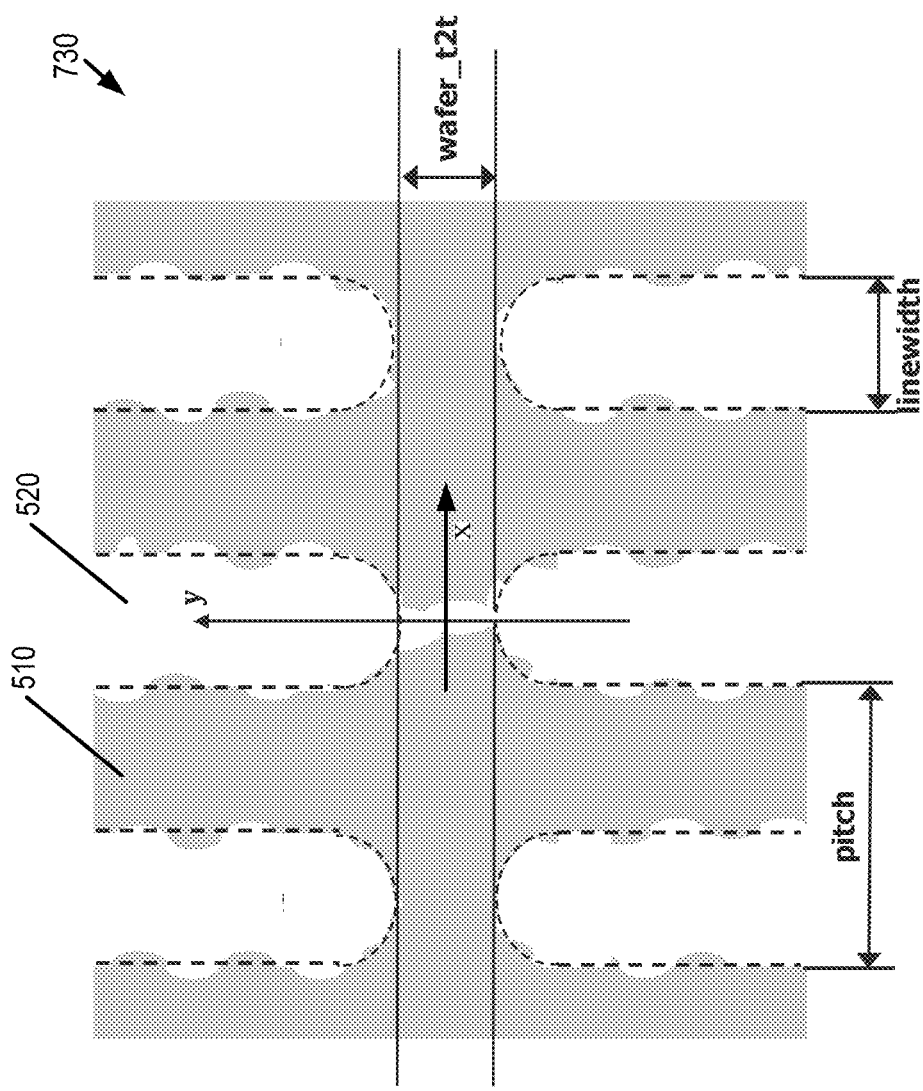
FIG. 7C is another illustration of the second resist representation with pinching in the t2t gap.

FIG. 7A is an illustration 700 of a second resist representation of grouped lines with a tip-to-tip (t2t) gap and the t2t gauge critical dimension (CD). FIG. 7B illustrates a graph 720 correlated to the second resist representation of FIG. 7A of the CD-based success criterion. FIG. 7C is another illustration 730 the second resist representation with pinching in the t2t gap. The following criteria are used for FIGS. 7A-C: pitch=44 nm; mask_linewidth=22 nm (on the mask, in wafer scale); wafer_t2t=10:4:42 nm; $\Delta$CD=2 nm or 4 nm. Further, as discussed above, various definitions of success or failure are contemplated. For a given gauge, a successful exposure may be defined as the exposure resulting in a resist material removal ($n_d(x) > T$) in the interior of the line ($|x| < 0.5(CD - \Delta CD)$) and the resist material retention ($n_d(x) < T$) outside the line ($|x| > 0.5(CD + \Delta CD)$). One choice for $\Delta$CD is 10% of the CD. Under this definition, the probabilities of success and failure are:

$$P_{success} = Pr((n_d(y) < T, \text{ for } |y| < 0.5(CD - \Delta CD)) \text{ and } (n_d(y) > T, \text{ for } |y| > 0.5(CD + \Delta CD))) \tag{30}$$

$$P_{failure} = 1 - P_{success} \tag{31}$$

Figure 7D:
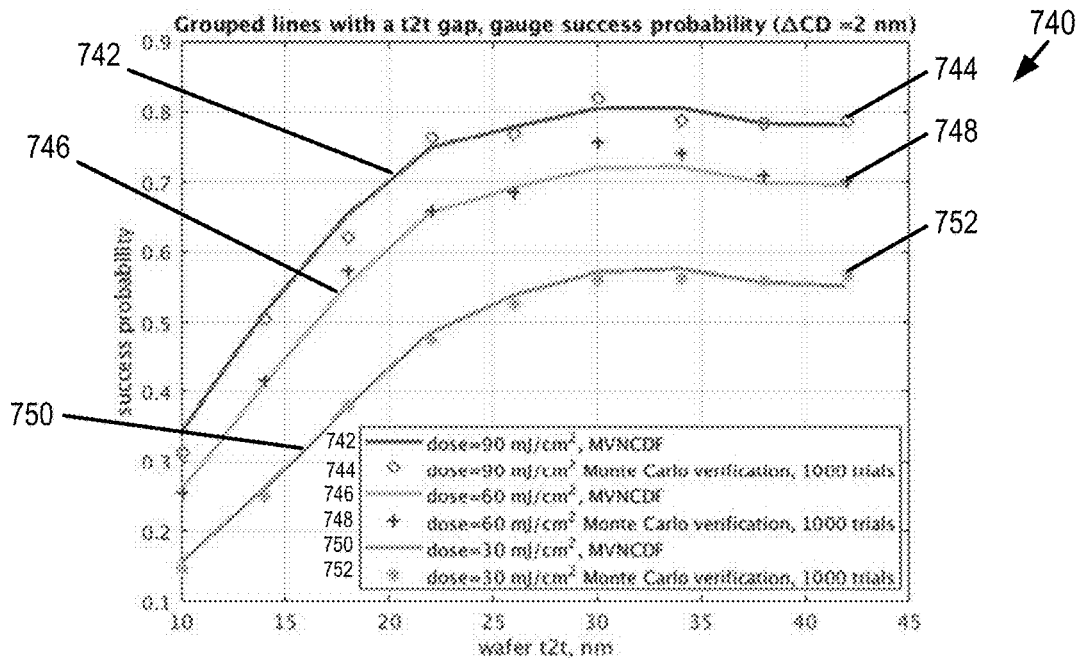
FIG. 7D illustrates a graph of a comparison of MVNCDF versus Monte Carlo simulations for the second resist representation of FIGS. 7A-C for ΔCD=2 nm.
Figure 7E:
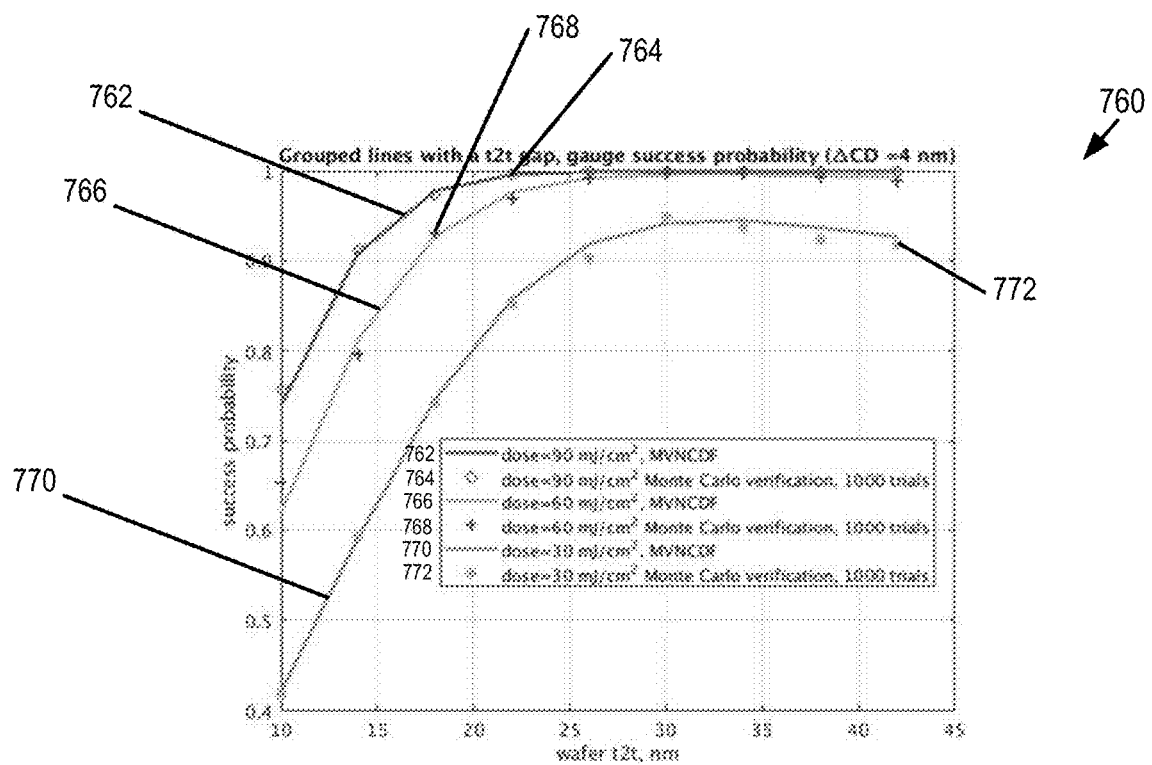
FIG. 7E illustrates a graph of a comparison of MVNCDF versus Monte Carlo simulations for the second resist representation of FIGS. 7A-C for ΔCD=4 nm.

As discussed above, using the disclosed methodology to calculate the probability, such as using MVNCDF, may provide comparable results to the computationally expensive Monte Carlo simulations. FIG. 7D illustrates a graph 740 of a comparison of MVNCDF versus Monte Carlo simulations for the second resist representation illustrated in FIGS. 7A-C for $\Delta$CD=2 nm. FIG. 7E illustrates a graph 760 of a comparison of MVNCDF versus Monte Carlo simulations for the second resist representation illustrated in FIGS. 7A-C for $\Delta$CD=4 nm.

As shown in FIG. 7D for $\Delta$CD=2 nm, the results are comparable for different doses: 30 mJ/cm$^2$: 750 for MVNCDF versus 752 for Monte Carlo simulation; 60 mJ/cm$^2$: 746 for MVNCDF versus 748 for Monte Carlo simulation; and 90 mJ/cm$^2$: 742 for MVNCDF versus 744 for Monte Carlo simulation. Likewise, as shown in FIG. 7E for $\Delta$CD=4 nm, the results are comparable for different doses: 30 mJ/cm$^2$: 770 for MVNCDF versus 772 for Monte Carlo simulation; 60 mJ/cm$^2$: 766 for MVNCDF versus 768 for Monte Carlo simulation; and 90 mJ/cm$^2$: 762 for MVNCDF versus 764 for Monte Carlo simulation.

Figure 8A:
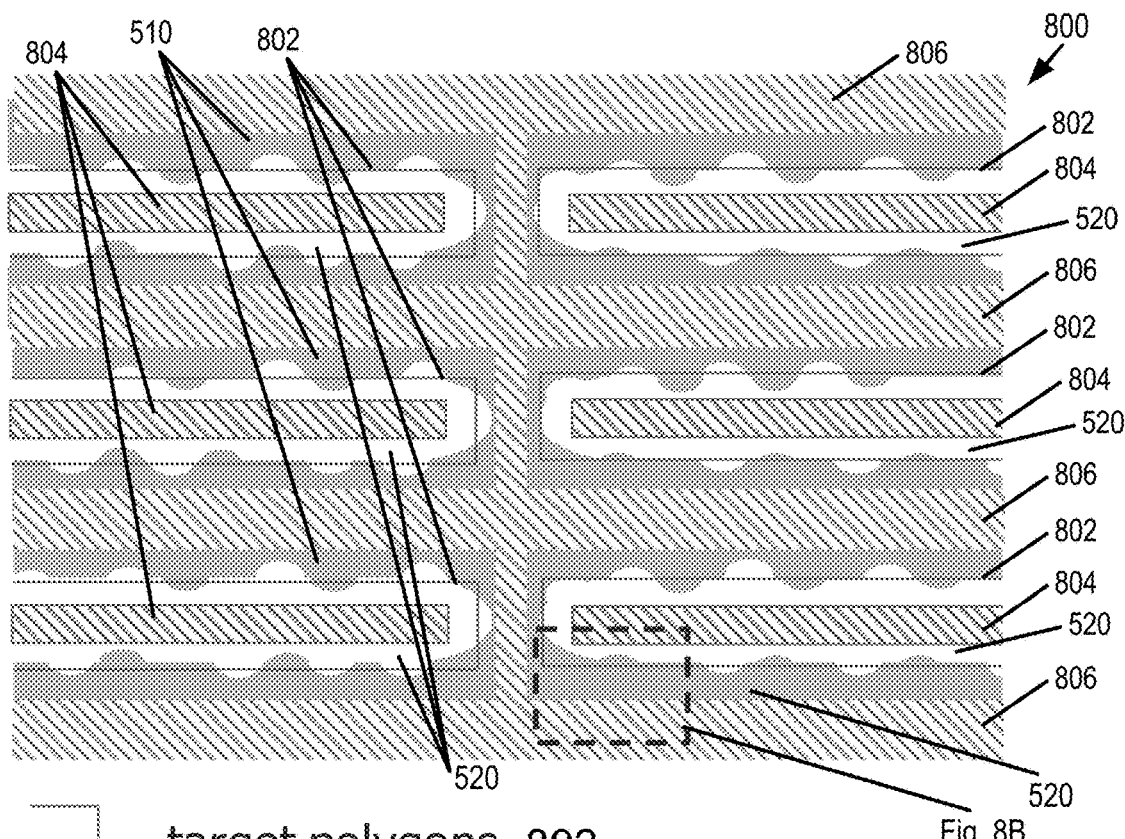
FIG. 8A illustrates a third resist representation of success probability estimation using integrity and isolation sets.
Figure 8B:
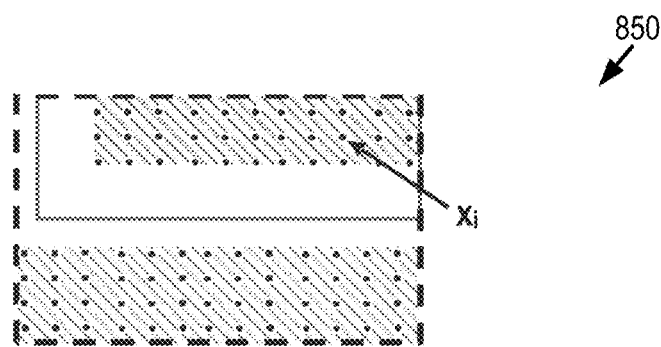
FIG. 8B is an expansion on a subsection of the third resist representation of FIG. 8A.

Further, success/failure may be defined in one of several ways, including based on integrity and/or isolation sets, as discussed above. FIG. 8A illustrates a third resist representation 800 of success probability estimation for target polygons 802 using integrity set N (804) and isolation set S (806). FIG. 8B is an expansion on a subsection 850 of the third resist representation of FIG. 8A, including $x_i$, a part of the integrity set N (804).

Specifically, for an interconnect, the integrity set N (804) may represent the core of the interconnect wire. To warrant that the wire is not cut anywhere, it is determined that the integrity set N (804) is fully deprotected. The isolation set S (806) may represent the core of the isolator. To warrant that the interconnect wires do not short anywhere, it is determined that the isolation set S (806) is fully protected. Thus, the integrity/isolation sets may be defined by applying, respectively, negative/positive bias to the target polygons (or various other shapes) and taking the interior/exterior of the resulting biased polygons (or various other shapes). Respectively, the probabilities of success or failure in exposing the pattern are:

$$P_{success}=Pr((n_d(x_i)>T, \text{ for all } x_i \in N) \text{ and } (n_d(x_i)<T, \text{ for all } x_i \in S)) \quad (32)$$

$$P_{failure}=1-P_{success} \quad (33)$$

Thus, calculating $P_{success}$, as defined above, for a generic pattern may involve filling the integrity set N (804) and the isolation set S (806) with the sampling points $x_i$ (e.g., at least 100 sampling points; at least 1,000 sampling points) and calculating MVNCDF for the number of dimensions corresponding to the number of these sampling points. Alternatively, an indication of the probability may be based on estimating the MVNCDF value using the Mahalanobis distance and the $\chi^2$ distribution (both discussed above).

Example Stochastic Model

Consider a two-dimensional nominal optical aerial image $\hat{I}_a(\vec{r})$ on a pixel located at $\vec{r}=(x, y)$ just above the resist surface. One may assume that resist blurs the aerial image with a Gaussian diffusion of size $\sigma_d$. The nominal intensity inside the resist $\hat{I}_r(\vec{r})$ is given by the convolution of optical image with gaussian diffusion $G(\vec{r}, \sigma_d)=e^{-r^2/2\sigma_d^2}/2\pi\sigma_d^2$ i.e.:

$$\hat{I}_r(\vec{r})=\hat{I}_a(\vec{r})\otimes G(\vec{r},\sigma_d) \quad (34)$$

The aerial intensity $I_a(\vec{r})$ may be used to calculate the nominal photon count $\hat{N}(\vec{r})$ on pixel by the relation:

$$\hat{I}(\vec{r})=\hat{I}_a(\vec{r})N_0/I_0 \quad (35)$$

where $I_0$ and $N_0$ are the clear field optical intensity and clear field photon-count respectively. $N_0$ is obtained from the physical dose (D), pixel area ($\Delta r^2$), and the energy of the photon (hv): $N_0=\Delta r^2 D/hv$.

Due to the stochastic effects, photon count ($N(\vec{r})$) at position($\vec{r}$) may follow the Poisson distribution with mean $\hat{N}(\vec{r})$ (e.g., probability that photon count is $n=\hat{N}^n e^{-\hat{N}}/n!$). Hence, the count at a certain pixel may deviate from its nominal value by the noise $\Delta N(\vec{r})=N(\hat{r})-\hat{N}(\vec{r})$. This noise in the incident photons translates to the noise in the optical image according to Equation 35 as:

$$I_a(\vec{r})=\hat{I}(\vec{r})+\Delta I_a(\vec{r}) \quad (36)$$

$$\Delta I_a(\vec{r})=(I_0/N_0)\Delta N(\vec{r}) \quad (37)$$

The noise in the optical image may translate to the noise in the blurred resist image as:

$$I(\vec{r})=\hat{I}_r(\vec{r})+\Delta I_a(\vec{r})\otimes G(\vec{r},\sigma_d) \quad (38)$$

$$\Delta I_a(\vec{r})\otimes G(r,\sigma_d)=I_0/N_0(N(\vec{r})\otimes G(\vec{r})-\hat{N}(\vec{r})\otimes G(\vec{r})) \quad (39)$$

In Equation 39, $X=N(\vec{r})\otimes G(\vec{r}, \sigma_d)$ is a stochastic variable obtained by convoluting a Poisson random variable with a Gaussian. The convolution with a Gaussian is equivalent to a weighted average with Gaussian weights. Therefore, by CLT, X is a normal random variable whose mean and variance is given by the relation:

$$\mu_X=\hat{N}(\vec{r})\otimes G(\vec{r},\sigma_d) \quad (40)$$

$$s_X=\hat{N}(\vec{r})\otimes G^2(\vec{r},\sigma_d) \quad (41)$$

Hence, the average ($\mu_I$) and standard deviation ($s_I$) of the stochastic resist intensity at a pixel at location $\vec{r}$ ($I(\vec{r})$ in Equation 39 is given by:

$$\mu_I(\vec{r})=\hat{I}_r(\vec{r}) \quad (42)$$

$$s_I(\vec{r})=(I_0/N_0)\sqrt{\hat{N}(\vec{r})\otimes G^2(r,\sigma_d)} \quad (43)$$

These parameters may provide the stochastic bounds to the resist intensity within a certain confidence interval. For a probability $\varphi$, the upper and lower bound to $I_r(\vec{r})$ are then calculated as:

$$I_r^{Upper}(\vec{r})=\hat{I}_r(\vec{r})+\alpha(I_0/N_0)\sqrt{\hat{N}(\vec{r})\otimes G^2(\vec{r},\sigma_d)} \quad (44)$$

$$I_r^{Lower}(\vec{r})=\hat{I}_r(\vec{r})+\alpha(I_0/N_0)\sqrt{\hat{N}(\vec{r})\otimes G^2(\vec{r},\sigma_d)} \quad (45)$$

where $\alpha$ is chosen such that for a standard normal variable x: Probability$(-\alpha\leq x\leq\alpha)=\varphi$ (e.g., $\alpha=3$ implies $\varphi=0.997$). The edge location is calculated where the resist intensity is equal to a certain threshold T (e.g., $I_r(\vec{r})=T$).

Figures 9A, 9B:
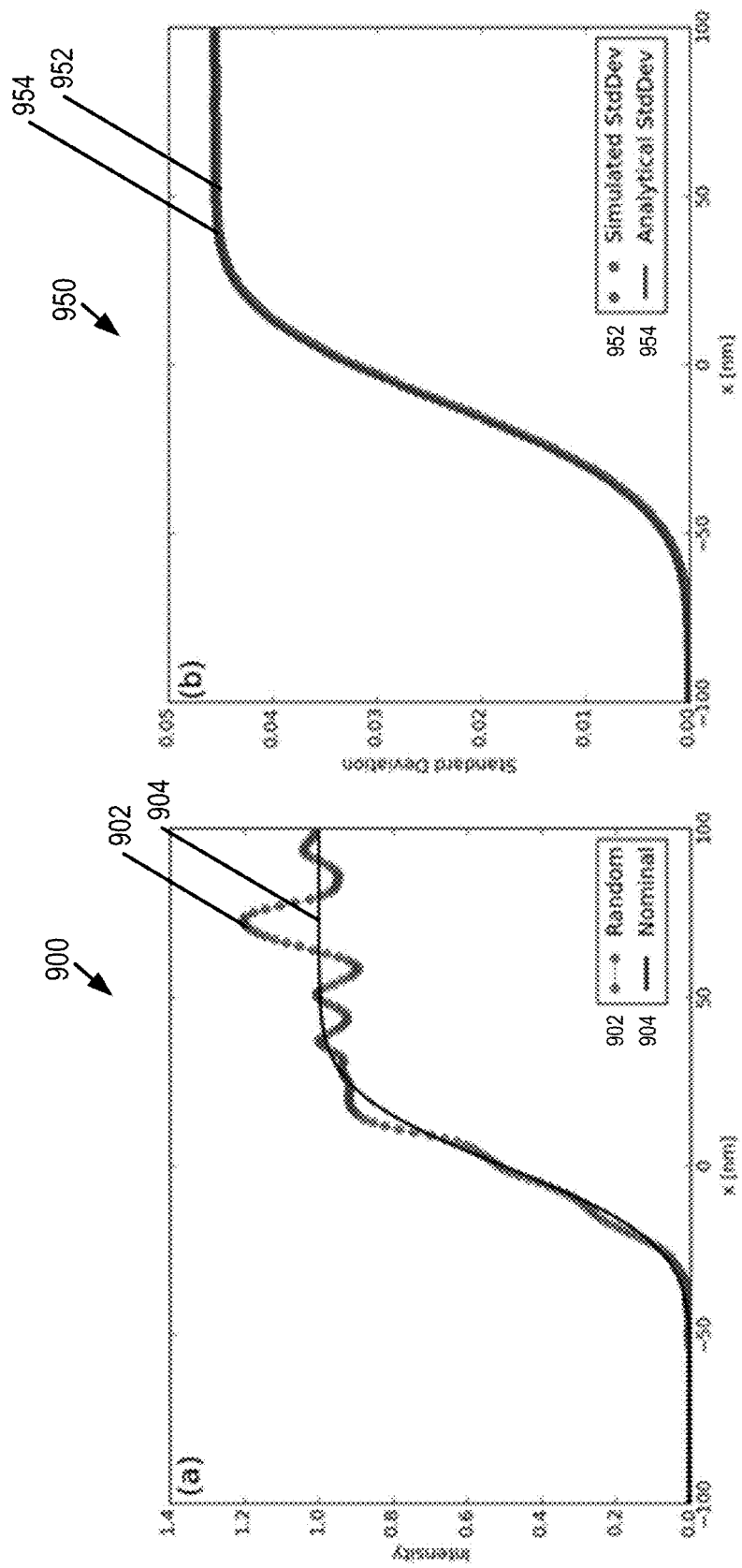
FIG. 9A is a graph of nominal and stochastic resist intensity calculated using different equations.
FIG. 9B is a graph of a comparison of standard deviation of intensity of each pixel calculated from 10000 random intensity profiles and the one calculated analytically.

Consider a 1-D example with a simulated optical intensity cutline $\hat{I}_a(x)=0.5(1+erf(x/\eta))$ for parameters $\eta=25$ nm, $\sigma_d=5$ nm, pixel size ($\Delta x$)=1 nm, D=40 mJ/cm$^2$ and $I_0=1$. FIG. 9A illustrates a graph 900 of the nominal resist intensity 904 (calculated from Equation 34) and one of the possible stochastic resist intensity profiles 902 due to photon shot noise (calculated from Equation 39). The standard deviation of intensity of each pixel is calculated using Equation 43 and compared to the one measured from 1000000 intensity profiles generated randomly according to Equation 39. As evident from the comparison shown in the graph 950 of FIG. 9B, the analytical standard deviation 954 matches perfectly with the measured standard deviation 952.

Figures 10A, 10B:
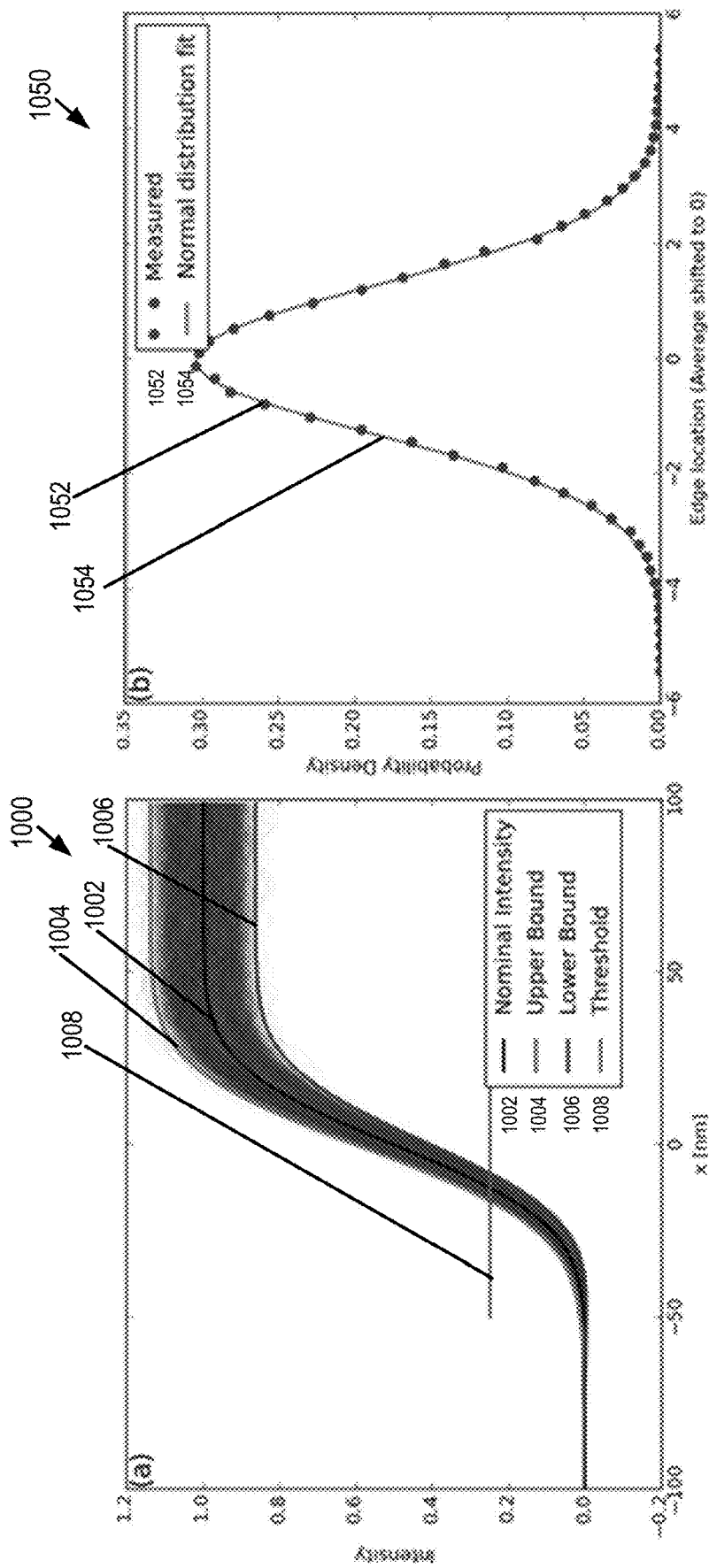
FIG. 10A is a graph of intensity bounds for resist intensity.
FIG. 10B is a graph of the probability distribution of the edge location.

FIG. 10A shows a graph 1000 of how well the intensity bounds (upper bound 1004, lower bound 1006) calculated by Equations 44 and 45 (as compared to the nominal resist intensity 1002 or the threshold 1008) for $\alpha=3$ are able to provide the bounds to the possible stochastic intensities with 99.7% confidence. The edge location is calculated for each of the random intensities for T=0.25, and its probability distribution is plotted in the graph 1050 of FIG. 10B. Measured 1052 are the probability distribution obtained from 1,000,000 runs while the line 1054 is a fit to normal distribution. In this way, it is shown that the probability distribution of the edge location resembles a normal distribution.

Figures 11, 11B:
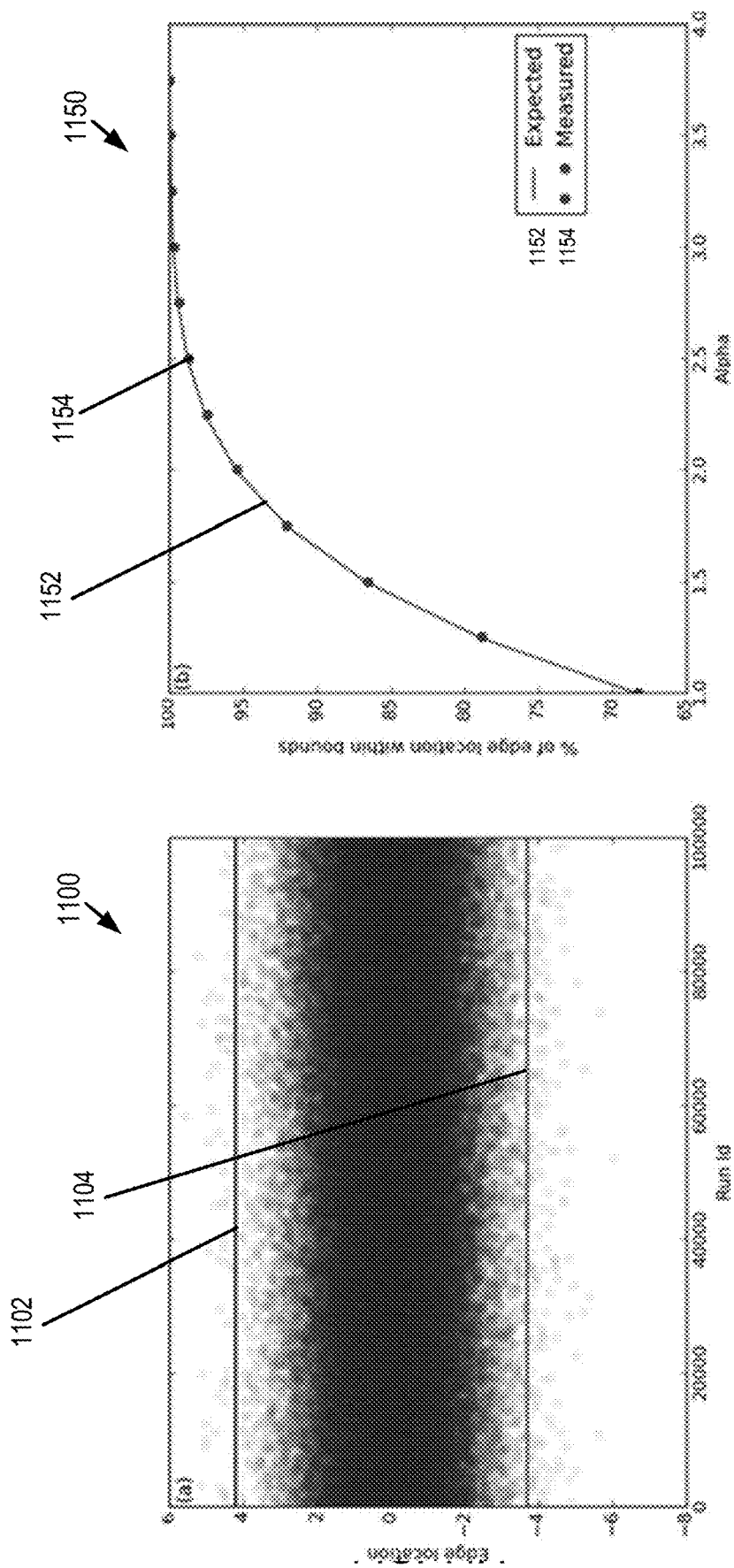
FIG. 11B is a graph of the percent of the edge locations inside the analytical bounds vs α.

The bounds of variation in edge location for a given threshold may be approximated by the points where $I_r^{Upper}(\vec{r})=T$, and $I_r^{Lower}(\vec{r})=T$. The accuracy of this approximation is shown in FIGS. 11A-B. Specifically, FIG. 11A illustrates a graph 1100 of the edge's location from 100000 random intensities, with upper line 1102 and lower line 1104 bounds for edge's location for $\alpha=3$. FIG. 11B is a graph 1150 of the percent of the edge locations inside the analytical bounds vs $\alpha$. Measured values 1154 are the measured probability from random runs while line 1152 is probability distribution as expected from CDF of normal distribution.

Figure 12A:
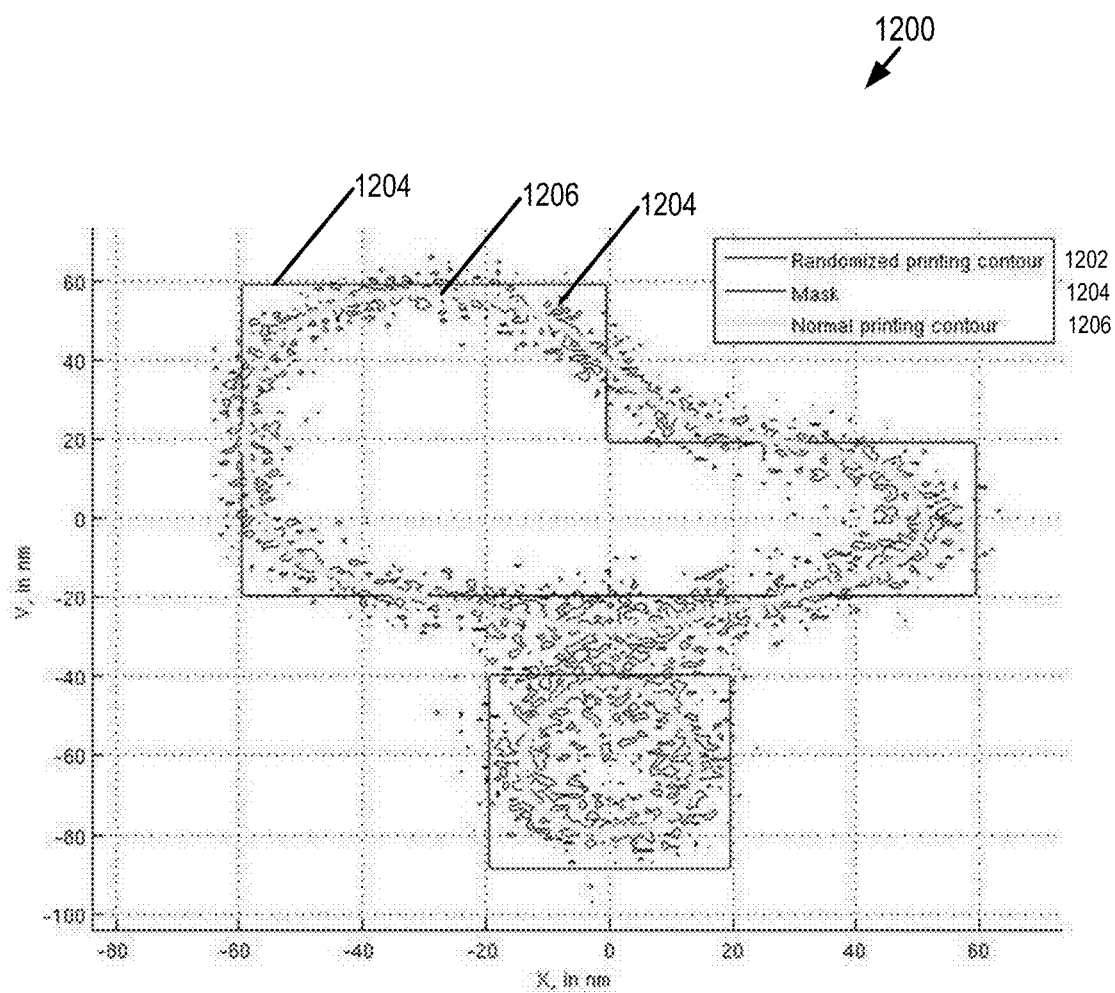
FIG. 12A is an illustration of the shot noise sample of 2D intensity illustrating the randomized printing contour d·Ir(x, y)=T and the normal printing contour d·I(x,y)=T.
Figure 12B:
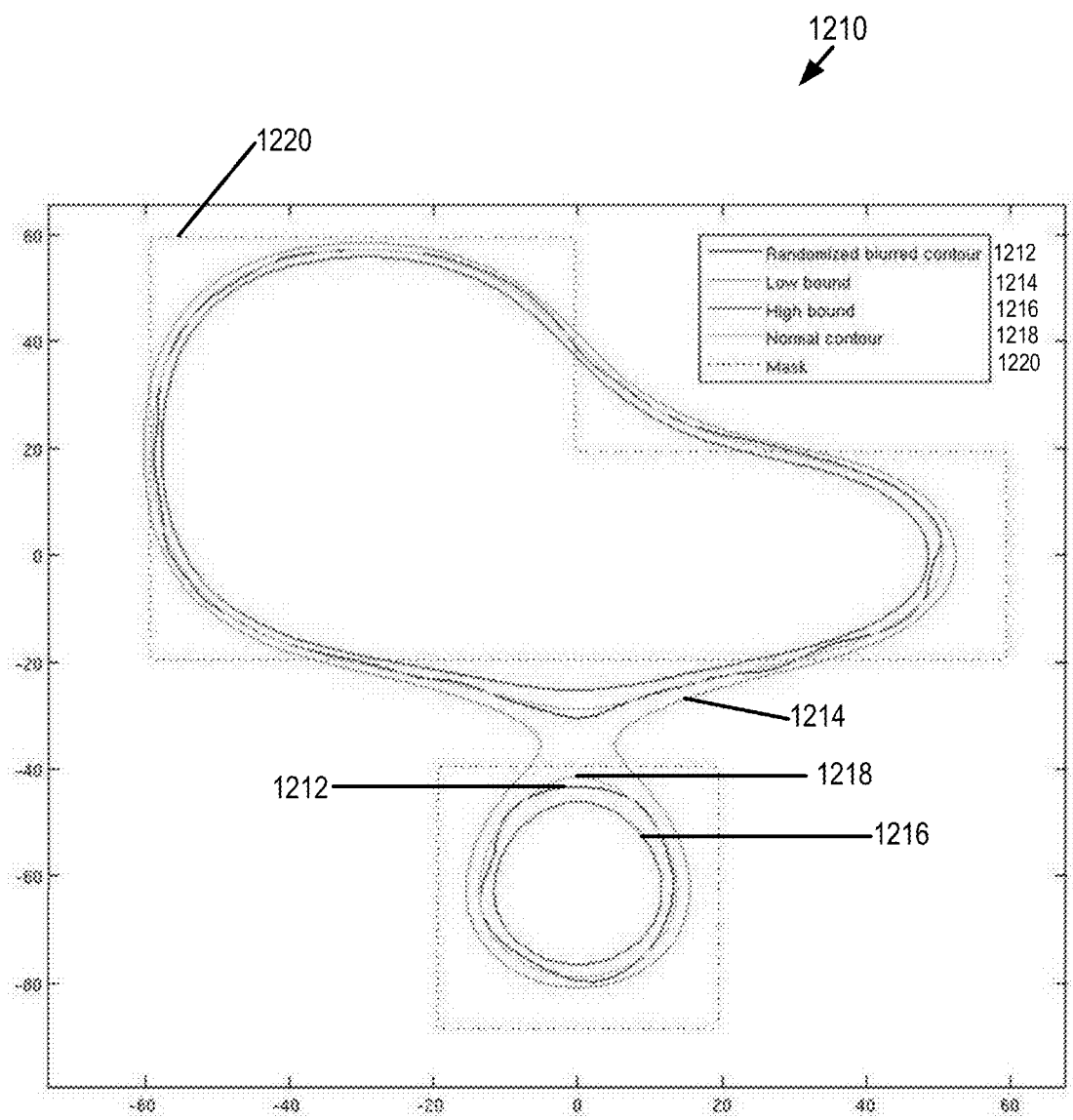
FIG. 12B is an illustration of high and low bounding contours and the sampled randomized blurred contour.
Figure 12C:
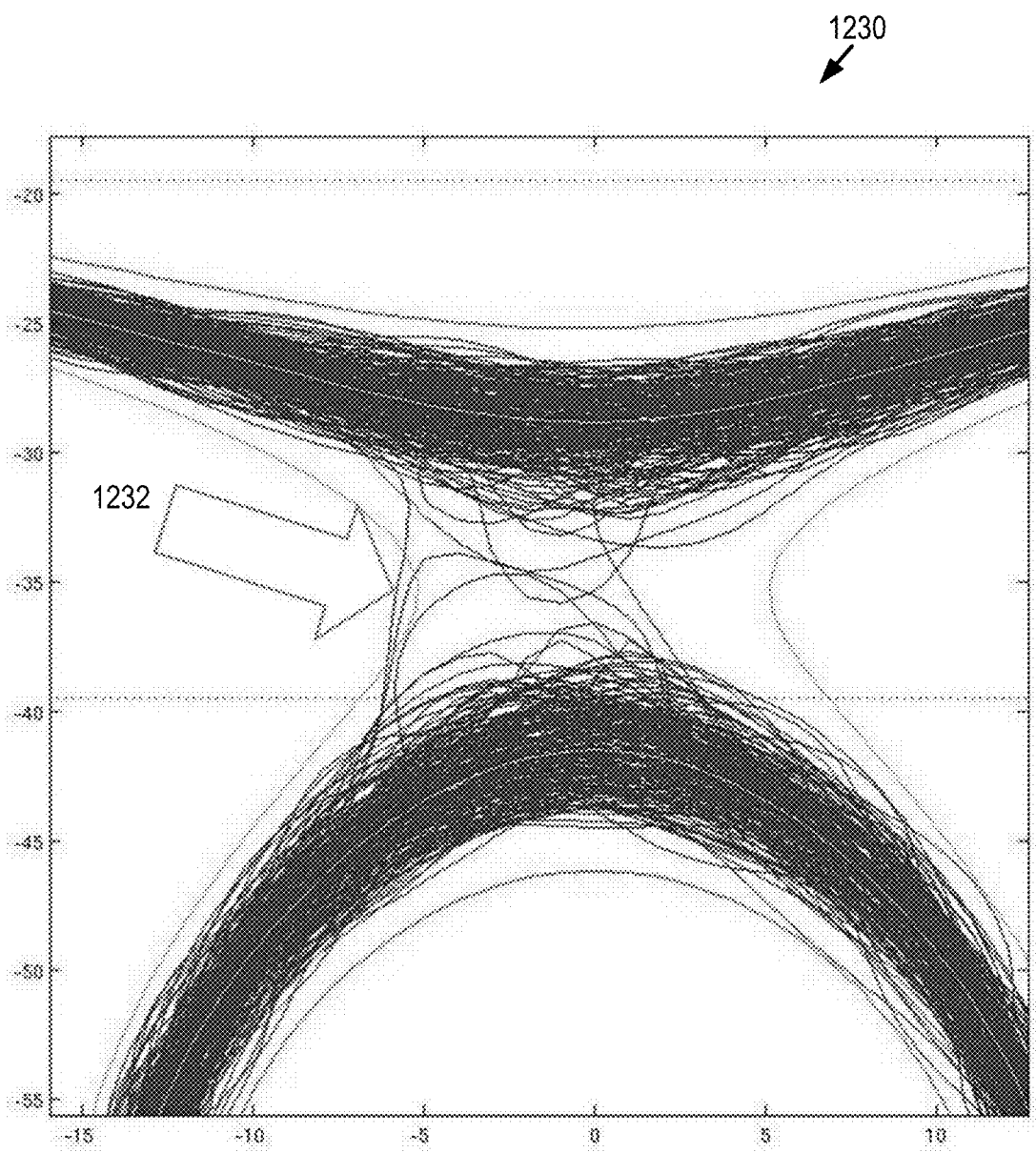
FIG. 12C is an illustration of 200 randomized contours overlap, where one highlighted random contour did bridge.

FIG. 12A is an illustration 1200 (with axes in nm) of the shot noise sample of 2D intensity illustrating the randomized printing contour (1202) d·Ir(x,y)=T and the normal printing contour (1206) d·I(x,y)=T for a printing mask (1204). FIG. 12B is an illustration 1210 of high bound 1216 and low bound 1214 contours, the normal contour 1218 and the sampled randomized blurred contour 1212 for mask 1220. FIG. 12C is an illustration 1230 of 200 randomized contours overlap, where one highlighted random contour (identified by arrow 1232) did bridge.

The following example embodiments of the invention are also disclosed:

Embodiment 1

A method, executed by at least one processor of a computer, of improving a lithographic process for imaging a portion of a layout design onto a substrate, the method comprising:

accessing a random field model configured to model stochastic randomness in one or both of exposure or resist process, the random field model configured to receive inputs to at least one light exposure parameter, at least one resist model parameter associated with resist used in the lithographic process, and at least one success or failure criterion, the random field model configured to generate a probability distribution function of deprotection concentration indicative of success or failure probability of the lithographic process;

inputting the at least one light exposure parameter, the at least one resist model parameter, and the at least one success or failure criterion to the random field model;

outputting, using the random field model, the indication of the success or the failure probability of the lithographic process; and modifying at least one aspect in the lithographic process in order to reduce an effect of the stochastic randomness in the lithographic process.

Embodiment 2

The method of embodiment 1,
wherein the random field model comprises a Gaussian random field model; and
wherein one or both of mean and covariance of the Gaussian random field model are calculated from intensity of an image in the resist and the one or more parameters of the resist process.

Embodiment 3

The method of any of embodiments 1 and 2,
wherein the random field model comprises a multivariate normal distribution model; and
wherein output of the multivariate normal distribution model comprises a mean vector and a covariance matrix of deprotection concentration at a plurality of sampling points.

Embodiment 4

The method of any of embodiments 1-3,
wherein the one or more indicators of the success or the failure of the lithographic process comprises a set of inequalities expressing a complete removal of the resist at a first set of user-defined areas of the resist and a complete retention of the resist at a second set of user-defined areas of the resist.

Embodiment 5

The method of any of embodiments 1-4,
wherein the one or more indicators of the success or the failure of the lithographic process comprises a cutline critical dimension-based success criterion in which determining the success of the lithographic process is based on:
placing a cutline across a defined area of the layout design; and
determining, based on removal or retention of the resist at user-defined portions of the cutline, the success or the failure of the lithographic process.

Embodiment 6

The method of any of embodiments 1-5,
wherein the one or more indicators of the success or the failure of the lithographic process comprises a cutline-based pinching or bridging criterion in which determining the success of the lithographic process is based on:
placing a cutline at an expected location of pinching or bridging; and
determining, based on complete removal or complete retention of the resist along the entire cutline, the success or the failure of the lithographic process.

Embodiment 7

The method of any of embodiments 1-6,
wherein the indication of the success or the failure probability of the lithographic process comprises a probability density function for a discrete set of points in the layout design.

Embodiment 8

The method of any of embodiments 1-7,
wherein the indication of the success or the failure probability of the lithographic process comprises a cumulative distribution function for a discrete set of points in the layout design.

Embodiment 9

The method of any of embodiments 1-8,
wherein the random field model comprises a multivariate normal distribution model; and
wherein determining the success or the failure of the lithographic process is based on a multivariate normal distribution cumulative distribution function.

Embodiment 10

The method of any of embodiments 1-9,
wherein the random field model comprises a multivariate normal distribution model;
wherein the one or more indicators of the success or the failure of the lithographic process comprises a set of inequalities expressing a complete removal of the resist at a first point on the resist or a complete retention of the resist at a second point on the resist; and
wherein a Mahalanobis distance is calculated as an indication of the success or the failure probability of the lithographic process.

Embodiment 11

The method of any of embodiments 1-10,
wherein determining the success or the failure probability of the lithographic process is based on machine learning.

Embodiment 12

The method of any of embodiments 1-11,
wherein machine learning comprises:
building, using one or more training sets generated by a multivariate normal distribution cumulative distribution function and using an artificial neural network or a support vector machine, a regression model; and
using the regression model in order to perform a probability calculation indicative of the success or the failure of the lithographic process.

Embodiment 13

The method of any of embodiments 1-12,
wherein determining the success or the failure probability of the lithographic process comprises using Rice's formula to estimate an average number of defects or a probability of a defect.

Embodiment 14

The method of any of embodiments 1-13,
wherein modifying the at least one aspect of the lithographic process comprises iteratively modifying a mask pattern of the lithographic process.

Embodiment 15

The method of any of embodiments 1-13,
wherein modifying the at least one aspect of the lithographic process comprises iteratively modifying at least one of a mask pattern, an illumination mode or an exposure dose for the lithographic process.

Embodiment 16

One or more non-transitory computer-readable media storing computer-executable instructions for causing one or more processors performance of a method according to any of embodiments 1-15.

Embodiment 17

A system, comprising: one or more processors, the one or more processors programmed to perform a method according to any of embodiments 1-15.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

The invention claimed is:

1. A method, executed by at least one processor of a computer, of improving a lithographic process for imaging a portion of a layout design onto a substrate, the method comprising:
   accessing a random field model configured to model stochastic randomness in one or both of exposure or resist process, the random field model configured to receive inputs of at least one light exposure parameter, at least one resist model parameter associated with resist used in the lithographic process, and at least one success or failure criterion, the random field model configured to generate a probability distribution function of deprotection concentration indicative of success or failure probability of the lithographic process, wherein the random field model comprises a Gaussian random field model, and wherein one or both of mean and covariance of the Gaussian random field model are calculated from intensity of an image in the resist and the one or more parameters of the resist process;
   inputting the at least one light exposure parameter, the at least one resist model parameter, and the at least one success or failure criterion to the random field model;
   outputting, using the random field model, the indication of the success or the failure probability of the lithographic process; and
   modifying at least one aspect in the lithographic process in order to reduce an effect of the stochastic randomness in the lithographic process.

2. The method of claim 1, wherein the random field model comprises a multivariate normal distribution model; and
   wherein output of the multivariate normal distribution model comprises a mean vector and a covariance matrix of deprotection concentration at a plurality of sampling points.

3. The method of claim 1, wherein the one or more indicators of the success or the failure of the lithographic process comprises a set of inequalities expressing a complete removal of the resist at a first set of user-defined areas of the resist and a complete retention of the resist at a second set of user-defined areas of the resist.

4. The method of claim 3, wherein the one or more indicators of the success or the failure of the lithographic process comprises a cutline critical dimension-based success criterion in which determining the success of the lithographic process is based on:
   placing a cutline across a defined area of the layout design; and
   determining, based on removal or retention of the resist at user-defined portions of the cutline, the success or the failure of the lithographic process.

5. The method of claim 3, wherein the one or more indicators of the success or the failure of the lithographic process comprises a cutline-based pinching or bridging criterion in which determining the success of the lithographic process is based on:
   placing a cutline at an expected location of pinching or bridging; and
   determining, based on complete removal or complete retention of the resist along the entire cutline, the success or the failure of the lithographic process.

6. The method of claim 1, wherein the indication of the success or the failure probability of the lithographic process comprises a probability density function for a discrete set of points in the layout design.

7. The method of claim 1, wherein the indication of the success or the failure probability of the lithographic process comprises a cumulative distribution function for a discrete set of points in the layout design.

8. The method of claim 1, wherein the random field model comprises a multivariate normal distribution model; and
   wherein determining the success or the failure of the lithographic process is based on a multivariate normal distribution cumulative distribution function.

9. The method of claim 1, wherein the random field model comprises a multivariate normal distribution model;
   wherein the one or more indicators of the success or the failure of the lithographic process comprises a set of inequalities expressing a complete removal of the resist at a first point on the resist or a complete retention of the resist at a second point on the resist; and
   wherein a Mahalanobis distance is calculated as an indication of the success or the failure probability of the lithographic process.

10. The method of claim 1, wherein determining the success or the failure probability of the lithographic process is based on machine learning.

11. The method of claim 10, wherein machine learning comprises:
building, using one or more training sets generated by a multivariate normal distribution cumulative distribution function and using an artificial neural network or a support vector machine, a regression model; and
using the regression model in order to perform a probability calculation indicative of the success or the failure of the lithographic process.

12. The method of claim 1, wherein determining the success or the failure probability of the lithographic process comprises using Rice's formula to estimate an average number of defects or a probability of a defect.

13. The method of claim 1, wherein modifying the at least one aspect of the lithographic process comprises iteratively modifying a mask pattern of the lithographic process.

14. The method of claim 1, wherein modifying the at least one aspect of the lithographic process comprises iteratively modifying at least one of a mask pattern, an illumination mode or an exposure dose for the lithographic process.

15. One or more non-transitory computer-readable media storing computer-executable instructions for causing one or more processors performance of a method comprising:
accessing a random field model configured to model stochastic randomness in one or both of exposure or resist process, the random field model configured to receive inputs of at least one light exposure parameter, at least one resist model parameter associated with resist used in a lithographic process, and at least one success or failure criterion, the random field model configured to generate a probability distribution function of deprotection concentration indicative of success or failure probability of the lithographic process, wherein the random field model comprises a Gaussian random field model, and wherein one or both of mean and covariance of the Gaussian random field model are calculated from intensity of an image in the resist and the one or more parameters of the resist process;
inputting the at least one light exposure parameter, the at least one resist model parameter, and the at least one success or failure criterion to the random field model;
outputting, using the random field model, the indication of the success or the failure probability of the lithographic process; and
modifying at least one aspect in the lithographic process in order to reduce an effect of the stochastic randomness in the lithographic process.

16. The non-transitory computer-readable media of claim 15, wherein the random field model comprises a multivariate normal distribution model; and
wherein output of the multivariate normal distribution model comprises a mean vector and a covariance matrix of deprotection concentration at a plurality of sampling points.

17. A system, comprising: one or more processors, the one or more processors programmed to perform:
accessing a random field model configured to model stochastic randomness in one or both of exposure or resist process, the random field model configured to receive inputs of at least one light exposure parameter, at least one resist model parameter associated with resist used in a lithographic process, and at least one success or failure criterion, the random field model configured to generate a probability distribution function of deprotection concentration indicative of success or failure probability of the lithographic process, wherein the random field model comprises a Gaussian random field model, and wherein one or both of mean and covariance of the Gaussian random field model are calculated from intensity of an image in the resist and the one or more parameters of the resist process;
inputting the at least one light exposure parameter, the at least one resist model parameter, and the at least one success or failure criterion to the random field model;
outputting, using the random field model, the indication of the success or the failure probability of the lithographic process; and
modifying at least one aspect in the lithographic process in order to reduce an effect of the stochastic randomness in the lithographic process.

* * * * *